(12) United States Patent
Sugai et al.

(10) Patent No.: US 6,571,312 B1
(45) Date of Patent: May 27, 2003

(54) DATA STORAGE METHOD AND DATA PROCESSING DEVICE USING AN ERASURE BLOCK BUFFER AND WRITE BUFFER FOR WRITING AND ERASING DATA IN MEMORY

(75) Inventors: Naoto Sugai, Tokyo (JP); Atsushi Settsu, Tokyo (JP); Saburo Kobayashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/504,713

(22) Filed: Feb. 16, 2000

(30) Foreign Application Priority Data

Feb. 19, 1999 (JP) .......................................... 11-041260

(51) Int. Cl.[7] ...................... G06F 13/00; G11C 16/10; G11C 16/16
(52) U.S. Cl. ................... 711/103; 711/165; 365/185.29
(58) Field of Search ................................. 711/103, 165; 365/185.11, 185.29, 185.33

(56) References Cited

U.S. PATENT DOCUMENTS

| | | | |
|---|---|---|---|
| 5,579,502 A | * 11/1996 | Konishi et al. | ............. 711/103 |
| 5,696,929 A | * 12/1997 | Hasbun et al. | ............... 711/103 |
| 5,699,297 A | * 12/1997 | Yamazaki et al. | ..... 365/185.11 |
| 5,802,551 A | * 9/1998 | Komatsu et al. | ............. 711/103 |
| 5,822,245 A | * 10/1998 | Gupta et al. | ........... 365/185.33 |
| 5,867,641 A | * 2/1999 | Jenett | ......................... 711/103 |
| 6,094,693 A | * 7/2000 | Haneda | ...................... 711/100 |

FOREIGN PATENT DOCUMENTS

| | | |
|---|---|---|
| JP | 5-233478 | 9/1993 |
| JP | 7-244992 | * 9/1995 |

* cited by examiner

*Primary Examiner*—Glenn Gossage
(74) *Attorney, Agent, or Firm*—Birch, Stewart, Kolash & Birch, LLP

(57) ABSTRACT

A data processing device includes flash memory 101; non-volatile memory 102 having an erasure block buffer 103 in which there are stored data recorded in an erasure-unit region of the flash memory 101; a write controller 111 for writing into the erasure block buffer 103 write request data which are to be written into the flash memory 101; a save unit 112 for saving non-changing data stored in the flash memory 101 to the erasure block buffer 103; an erasure instruction unit 301 for instructing erasure of the data from the erasure-unit region of flash memory 101; and a write unit for writing the data recorded in the erasure block buffer 103 to the flash memory 101. A comparison may be made between the erasure unit regions into which first and second write data are to be written. The data processing device may further include a write buffer for storing write data.

15 Claims, 16 Drawing Sheets

WRITE BUFFER MANAGEMENT REGION

| ERASURE UNIT NUMBER | OFFSET VALUE FOR SPECIFYING POSITION OF A WRITE REGION IN ERASURE-UNIT REGION | DATA SIZE |
|---|---|---|
| 1 | 0 x 1000 | 4096 |
| 8 | 0 | 4096 |
| -1 | | |

FIG. 15

WRITE BUFFER MANAGEMENT REGION

| ERASURE UNIT NUMBER | OFFSET VALUE FOR SPECIFYING POSITION OF A WRITE REGION IN ERASURE-UNIT REGION | DATA SIZE | WRITE NUMBER | NUMBER OF TIMES DATA ARE WRITTEN |
|---|---|---|---|---|
| 1 | 0 x 1000 | 4096 | 3 | 3 |
| 8 | 0 | 4096 | 4 | 1 |
| 10 | 0 x 4000 | 4096 | 9 | 2 |
| 22 | 0 | 4096 | 10 | 3 |

DATA STORAGE METHOD AND DATA PROCESSING DEVICE USING AN ERASURE BLOCK BUFFER AND WRITE BUFFER FOR WRITING AND ERASING DATA IN MEMORY

BACKGROUND OF THE INVENTION

The present invention relates to a memory having a plurality of erasure-unit regions in which data are erased or written in predetermined units, and more particularly, to a data processing device using, e.g., flash memory.

Flash memory corresponds to semiconductor memory in which data can be electrically written or from which data can be electrically erased. Flash memory is characterized by the ability to retain memory contents without a power supply. Particularly in the field of industrial computers, flash memory is often used as a storage medium, substituting a hard disk.

However, new data cannot be written directly in flash memory. More specifically, data must be collectively erased in units of, for example 64K (Kilobytes) (hereinafter referred to as "erasure units"), before new data is written in the flash memory. After data has been erased in erasure units, new data corresponding to the size of the erased data is written, thus rewriting the data stored in the flash memory.

Particularly, from a structural viewpoint, in large-capacity and high-density flash memory, an erasure unit is larger than the unit for rewriting (hereinafter referred to as a "rewriting unit"). For this reason, in many cases, data used for rewriting is greater in size than the erasure unit. Even in a case where such data is rewritten into the flash memory, data must be erased in erasure units, which may comprise data segments that do not need to be rewritten, and the data containing the erased data segments must be written into the flash memory again.

A technique for rewriting data in flash memory is described in the Unexamined Japanese Patent Application Publication Kokai No. Hei 5-233478. FIG. 18 is a block diagram showing the schematic of the background art. The operation of the circuit will now be described with reference to FIG. 18.

This circuit consists of a Central Processing Unit (CPU) 1, an Erasable Programmable Read-Only Memory (EPROM) 2, and Static Random Access Memory (SRAM) 3, and Flash Random Access Memory (FRAM) 4, a register 5, and an address bus 9 and a data bus 10 which connect them. The register 5 is used to save the information of the FRAM 4. Further, the CPU 1 is connected to an FRAM rewritten information transfer terminal 7 and an FRAM rewritten information file 8 through an RS232C line 6, and the terminal 7 is operated to send the rewritten information in the file 8 to the CPU 1. Further, information, before the FRAM 4 is all erased or rewritten, is saved in the register 5 temporarily. The saved information is then returned into the FRAM 4 from the register 5 after the FRAM 4 is rewritten.

A data rewriting operation of FRAM 4 will be described. Data that is to be rewritten into the FRAM 4 is downloaded into SRAM 3. Data pertaining to an area of the FRAM 4 that is not subjected to rewriting is copied to a register 5. All the contents of the FRAM 4 are deleted by a FRAM clear program stored in EPROM 2. The data that has been downloaded into the SRAM 3 is copied to the FRAM 4. Further, the data that has been saved in the register 5 is copied to the original area on the FRAM 4.

In the prior art, in a case where volatile memory is used as the register 5 which acts as an area into which data are saved at the time of rewriting of the flash memory, in the event that supply of power to the data processing device is interrupted after erasure of data, data pertaining to an area not to be subjected to rewriting, as well as data pertaining to an area to be subjected to rewriting, are lost, thus deteriorating the reliability of flash memory.

In order to prevent loss of the data recorded in the register, the data must be written into flash memory immediately. From an operational viewpoint, flash memory must be erased every time the data stored in flash memory is rewritten. Eventually, the flash memory must be subjected to the number of erasing operations corresponding to the number of times data is rewritten. A limitation, however, is imposed on the number of times flash memory can be subjected to erasure (usually 100,000 times or thereabouts). The number of times that flash memory is subjected to erasure, however, is increased in the prior art, shortening the life of the flash memory. Thus, the number of times the flash memory is subjected to erasure must be decreased.

Therefore, it is an object of the present invention to overcome the aforementioned problems.

SUMMARY OF THE INVENTION

The present invention has been conceived to solve such problems of the prior art and is aimed at providing a data processing device which prevents erasure of data from flash memory, when the data recorded in the flash memory is rewritten, and further exhibits improved reliability when data is written into the flash memory.

A further object of the present invention is to provide a data processing device that minimizes the number of times that flash memory is subjected to erasure. This is achieved through the use of a simple structure, which maintains reliability, when a limitation is imposed on the number of times that flash memory can be subjected to erasure.

Accordingly, a data storage method for rewriting data into a memory is provided. Write data is written to an erasure block buffer, which comprises a first region of a nonvolatile memory. Non-changing data is copied from the memory to the erasure block buffer, whereby the memory has a plurality of erasure-unit regions and the non-changing data is written in predetermined units. An erasure unit number is recorded to an erasure-unit-number hold region, the erasure-unit-number hold region comprising a second region of the non-volatile memory. Non-changing data is then erased only from the erasure-unit regions, which are to be rewritten. A status of the erasure unit number is determined, and the non-changing data and the write data is transferred from the erasure block buffer to the erasure-unit region in the memory, depending on the status of the erasure unit number. If an interruption of the transferring step occurs, the transferring step is resumed in response to the status of the erasure unit number. The erasure unit number is subsequently nullified in the erasure-unit-number hold region when the transferring step is complete.

Moreover, the write data is written in response to a first write request, which requests writing of the write data into the erasure-unit region of the memory. The non-changing data is copied in response to the first write request, and the non-changing data is erased from the erasure-unit region after the non-changing data is completely copied.

A second write data is then written into a write buffer in response to a second write request for requesting writing of the second write data, after the step of writing write data, whereby the write buffer comprises a third region of the non-volatile memory. The write data and non-changing data, in the erasure block buffer, are transferred into the erasure-unit region after second write data is written.

Furthermore, the status of the erasure unit number is determined by comparing the erasure-unit region, to which the write data is to be written, with the erasure-unit region, to which the second write data is to be written. In a case where a match is obtained, processing pertaining to the writing second data and processing pertaining to transferring the write data and non-changing data are performed.

In a further embodiment, a data storage method is provided, for rewriting data into a memory having a plurality of erasure-unit regions. Write data is written to a nonvolatile erasure block buffer. Non-changing data, which is written in predetermined units, is copied from the memory to the erasure block buffer. The non-changing data is then erased from the erasure-unit regions. Both of the non-changing data and the write data are then transferred from the erasure block buffer to the memory. First write data is written, during a first erasure block buffer write step, to the erasure block buffer, in response to a first write request for requesting writing of the first write data into a first erasure-unit region of the memory. The non-changing data, recorded in the first erasure-unit region, is written to the erasure block buffer during a second erasure block buffer write step, in response to the first write request for requesting writing of the first write data to the first erasure-unit region of the memory. Data is then erased, during an erasure step, from the first erasure-unit region, after the second erasure block buffer write step. Finally, the data stored in the erasure block buffer is written to the first erasure-unit region, from which the data have been erased, in response to a second write request for requesting writing of second write data into the memory.

Furthermore, the erasure step is followed by a comparison step of comparing the erasure-unit region into which the first write data is to be written with the erasure-unit region into which the second write data is to be written. In a case where a match is obtained as a comparison result in the comparison step, processing pertaining to writing the data stored in the erasure block buffer to the first erasure-unit region is performed.

In yet another embodiment, a data storage method for rewriting data into a memory having a plurality of erasure-unit regions is provided. First write data is written to an erasure block buffer that comprises a first region of a nonvolatile memory. Second write data is written to a write buffer that comprises a second region of the nonvolatile memory. Non-changing data, which is written in predetermined units, is copied from the memory to the erasure block buffer. An erasure unit number is then recorded to an erasure-unit-number hold region. The erasure-unit-number hold region comprising a third region of the non-volatile memory. Thereafter, the non-changing data is erased only from the erasure-unit regions, which are to be rewritten. Subsequently, a status of the erasure unit number is determined, and the non-changing data and the first and second write data are transferred to the memory. Whereby, the non-changing data is transferred from the erasure block buffer, the first write data is transferred from the erasure block buffer, and the second write data is transferred from the write buffer in response to the status of the erasure unit number. Furthermore, during an interruption of the transferring, the transferring process is resumed, depending on the status of the erasure unit number. Finally, the erasure unit number in the erasure-unit-number hold region is nullified, when the transferring step is complete.

As such, writing the first write data into the erasure block buffer and copying the non-changing data into the erasure block buffer, is performed in response to a first write request for requesting writing of a first write data into the first erasure-unit region of the memory. Wherein, second write data is written into the write buffer, in response to a second write request for requesting writing of the second write data into a second erasure-unit region of the memory, after the erasure block buffer has been written to. Also, third write data is written into the write buffer, in response to a third write request for requesting writing of the third write data into an erasure-unit region of the memory, after the second write data has been written into the write buffer.

Additionally, the status of the erasure unit number is determined by comparing a write request region, which specifies a location in the memory in which the second write data is to be written, with a write request region that specifies a location in the memory in which the third write data is to be written. If the write request region, to which the third write data is to be written, is included in the write request region in which the second write data is to be written, the third write data overwrites the area of the write buffer where the second write data is written.

Moreover, the first write data is written into the erasure block buffer and the non-changing data is copied into the erasure block buffer, in response to a first write request for requesting writing of the first write data into the a first erasure-unit region of the memory. The second write data is written into the write buffer, in response to a second write request for requesting writing of the second write data into a second erasure-unit region of the memory, after the first write data is written and the non-changing data is copied into the erasure block buffer. Wherein, the non-changing data and the first write data is transferred from the erasure unit region into the memory, after the second write data is written into the write buffer and in a case where there arises a third write request for requesting writing third write data into an erasure-unit region of the memory. Also, the second write data, the third write data, and the non-changing data, stored in the second erasure-unit region, is written into the erasure block buffer after the non-changing data and the first write data is transferred from the erasure unit region into the memory.

Plus, the status of the erasure unit number is determined by comparing the erasure-unit region, into which the second write data is to be written, with the erasure-unit region, into which the third write data is to be written. If a match is obtained, processing pertaining to writing the second data and processing pertaining to transferring the first write data and the non-changing data, are performed.

Hence, a data processing device is also provided, which includes: a memory having a plurality of erasure-unit regions wherein data is written in predetermined units into the erasure-unit regions, and wherein data is erased in predetermined units from the memory; an erasure block buffer comprising a first region of a nonvolatile memory, the erasure block buffer permits writing of data to the memory in arbitrary units, stores data that is erased to the memory; and an erasure-unit-number hold region comprising a second region of the non-volatile memory for recording an erasure unit number, wherein during an interruption of processing, a status of the erasure unit number is determined and depending on the status, processing resumes.

The data processing device further includes: an erasure means for erasing the data stored in the erasure-unit regions in the predetermined units and for rewriting the data stored in the erasure-unit region through use of first write data; a write control means that includes a data write means for writing the first write data into the erasure block buffer; a save means for writing, into the erasure block buffer, non-changing data which are not to be rewritten by the first write data from among the data stored in the erasure-unit region of the memory; and a memory write means for writing the first write data and the non-changing data, both data sets being written into the erasure block buffer, into the erasure-unit region from which the data have been erased by the erasure means.

Whereby the erasure block buffer for stores both write data that is to be written into the erasure-unit region and non-changing data stored in the erasure-unit region. The data processing device also further comprises write control means that includes a data write means for writing first write data into the erasure block buffer, in response to a first write request for requesting writing of the first write data into a first erasure-unit region of the memory; a save means for writing into the erasure block buffer non-changing data stored in the first erasure-unit region, in response to the first request for requesting writing of the first write data into the first erasure-unit region of the memory; and a memory write means for writing into the first erasure-unit region the data written in the erasure block buffer. As such, the erasure block buffer retains the first write data and the non-changing data, stored in the first erasure-unit region, until a second write request is issued after the first write request and the data write means writes the second write data into the erasure block buffer in a case where the second write request requests writing of the second write data into the first erasure-unit region, and the memory write means writing, to the first erasure-unit region, data belonging to the erasure block buffer in which the second write data are written.

Alternatively, the data processing device may also include: a write buffer, which comprises a third region of the nonvolatile memory, for storing the write data without storing the non-changing data; a write control means that includes a data write means for writing first write data into the erasure block buffer, in response to a first write request for requesting writing of the first write data into a first erasure-unit region of the memory; a save means for writing into the erasure block buffer non-changing data stored in the first erasure-unit region, in response to the first request for requesting writing of the first write data into the first erasure-unit region of the memory; and a write buffer write means, which is included in the write control means, for writing second write data into the write buffer, in response to a second write request for writing the second write data into a second erasure-unit region of the memory. Wherein the write buffer retains the second write data until a third write request is issued after the second write request. Wherein the write buffer write means writes third write data into the write buffer in a case where the third write request requests writing of the third write data into the write request region for the second write data.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 15 is a table showing an example of data pertaining to the frequency of use of a write buffer region;

DETAILED DESCRIPTION OF THE PREFERRED EMBODIMENTS

First Embodiment

Figure 1:
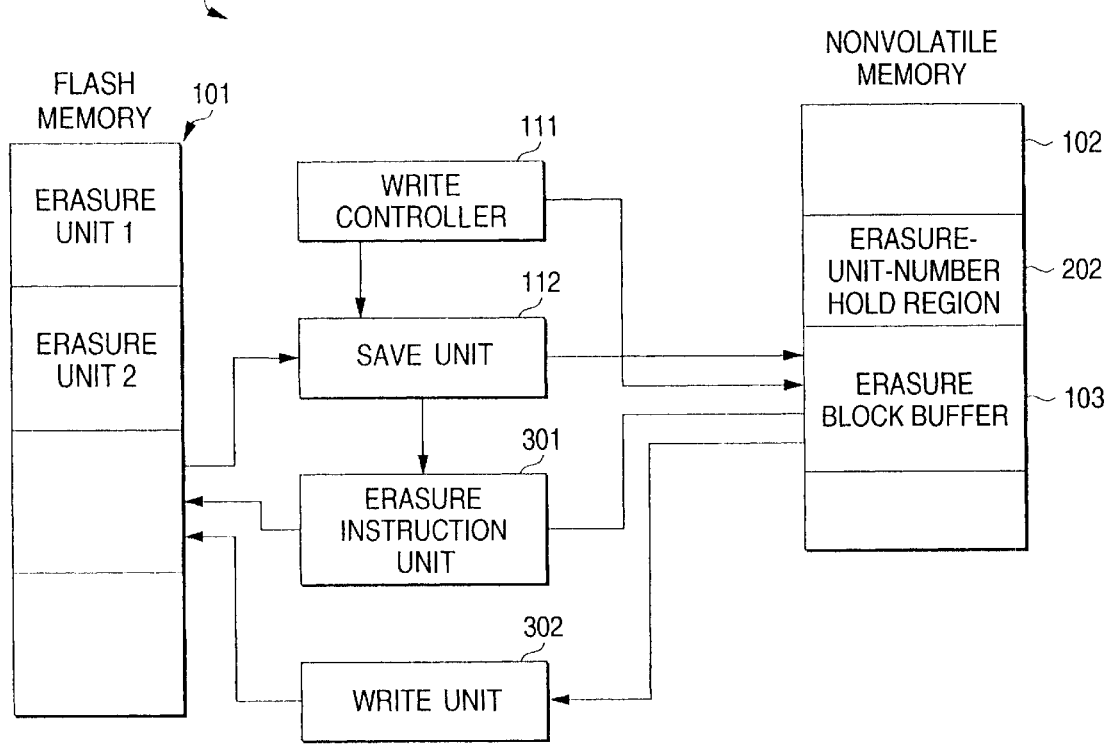
FIG. 1 is a block diagram showing a data processing device according to a first embodiment of the present invention.

FIG. 1 is block diagram showing the configuration of a data processing device 100 according to a first embodiment of the present invention. In FIG. 1, reference numeral 101 designates a flash memory comprising a plurality of erasure-unit regions. In this flash memory 101, data is erased or rewritten in predetermined units (hereinafter referred to as "erasure units").

Reference numeral 102 designates a nonvolatile memory which does not need to erase data for rewriting purpose in predetermined erasure units, as is required by the flash memory. The nonvolatile memory 102 also permits writing data directly in arbitrary units. More specifically, the nonvolatile memory 102 corresponds to battery backup SRAM.

Reference numeral 103 designates an erasure-block buffer, which is provided in the battery backup SRAM, serving as the nonvolatile memory 102, and has sufficient capacity for saving and recording the data stored in one erasure-unit region of the flash memory 101. In the first embodiment, the erasure-block buffer 103 has the same capacity as the erasure-unit region. The erasure-block buffer 103 is formed on the battery backup SRAM (i.e., the nonvolatile memory 102) and can write data in arbitrary units. Write controller 111 controls the writing of data into the flash memory 101; save unit 112 saves the data, stored in the erasure-unit region to which data is to be written, to the erasure-block buffer 103. Erasure instruction unit 301 issues an instruction for erasing the data, stored in the erasure-unit region, to the flash memory 101. Write unit 302 writes "write data" into the flash memory 101. The term "write data" used herein defines data to be written into memory, such as the flash memory 101 and the nonvolatile memory 102. Write data contained in a write request is called "write request data."

Reference numeral 202 designates an erasure-unit-number hold region, which is provided in the nonvolatile memory 102, and records an erasure unit number.

Figure 2:
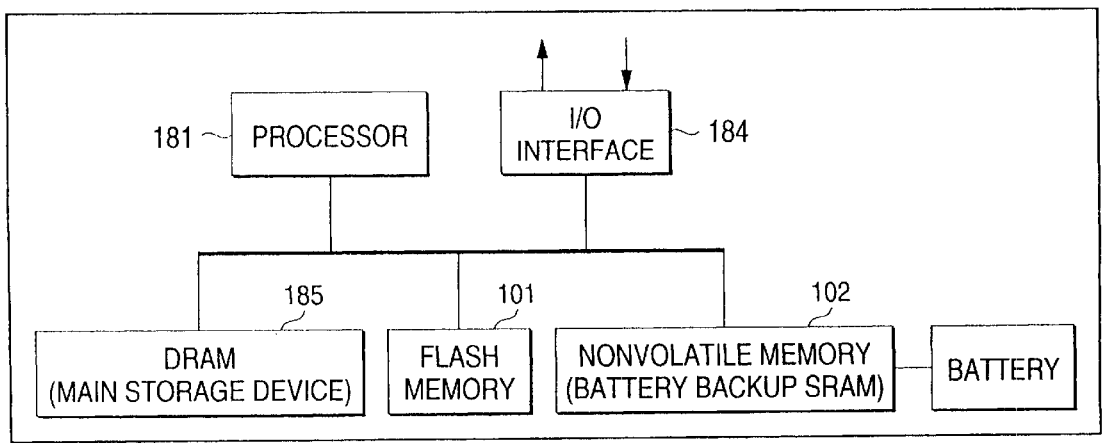
FIG. 2 is a block diagram showing the system of the first embodiment.

FIG. 2 is a block diagram showing the specific system of the first embodiment. Reference numeral 181 designates a processor; 102 designates battery backup SRAM; 101 designates flash memory; 184 designates an I/O interface; and 185 designates DRAM serving as a main storage device or primary storage area. The write controller 111, the save unit 112, the erasure instruction unit 301, and the write unit 302 are effected through the execution of software by the processor 181. The data stored in the erasure-unit region of the flash memory 101 are erased by hardware; i.e., the flash memory 101 which has received an erasure instruction from the erasure instruction unit 301. Specifically, the erasure of the data in erasure units is effected by erasure means (not shown) of the flash memory 101. New data is rewritten when the processor 181 receives a write request from, for example, the I/O interface 184.

Figure 3:
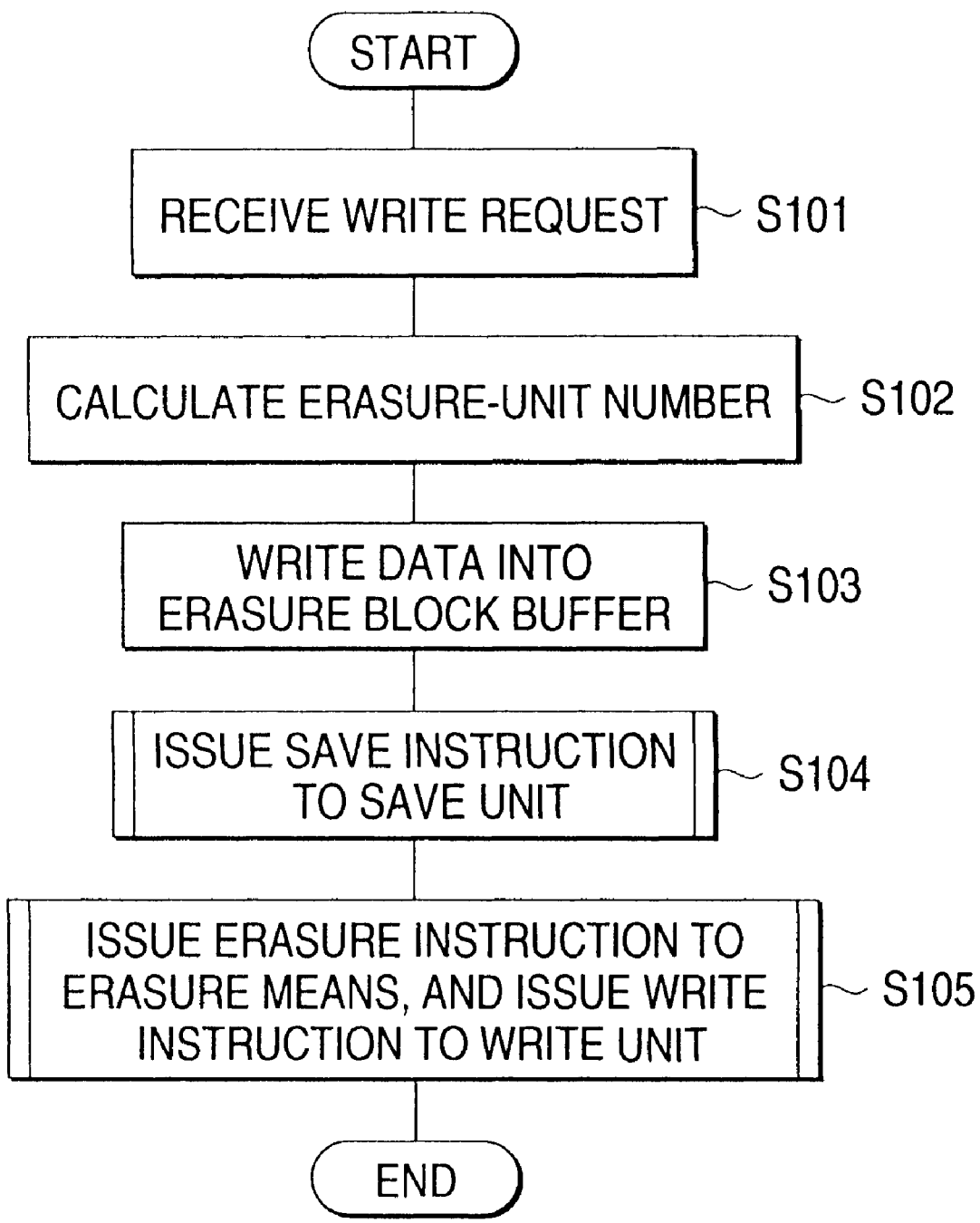
FIG. 3 is a flowchart showing the operation of the data processing device of the first embodiment for rewriting data stored in flash memory.

The rewriting of data into the flash memory 101 will now be described in accordance with the present embodiment. FIG. 3 is a flowchart describing the rewriting of data into the flash memory 101 by the data processing device 100, in accordance with the first embodiment of the present invention. Unless otherwise specified, the write controller 111 performs the following processing operations.

In step S101, the write controller 111 receives a request for writing data into the flash memory 101. The write request contains write request data serving as write data; a write request region for specifying an address of the flash memory into which the write data is to be written; and information about the size of the write data.

In step S102, a number assigned to the erasure unit, which includes the write request region and the position corresponding to the write request region within the erasure unit, is calculated from the size of the erasure unit and by reference to the write request region. The write request region serves as an address for specifying the relative position of the overall flash memory 101, and the position within the erasure unit specifies the relative position within a specific erasure unit.

In step S103, write request data is written into a position within the erasure-block buffer 103 corresponding to the write request region. More specifically, the write request data are written into a position in the erasure-block buffer 103, that corresponds to the location in the erasure unit that was calculated in step S102.

In step S104, the write controller 111 issues a save instruction to the save unit 112. The save instruction comprises numbers assigned to the erasure units, and information about the position in the erasure unit that corresponds to the write request region. Upon receipt of the save instruction, the save unit 112 writes into the erasure-block buffer 103 non-changing data, which corresponds to the erasure unit number, that was calculated in step S102, within the erasure-unit region and which corresponds to data other than the data sets written in step S103. The term "non-changing data" used herein is data that are data sets of the data stored in the erasure unit region and are not written by the write request data.

In step S105, the write controller 111 issues an erasure instruction to the erasure instruction unit 301. The erasure instruction contains numbers assigned to the erasure units of the flash memory 101. Upon receipt of the erasure instruction, the erasure instruction unit 301 issues to the erasure unit of the flash memory 101 an instruction for erasing one erasure unit in the flash memory corresponding to the number assigned to the erasure unit. After the erasure unit of the flash memory 101 completes the erasure of the data, the write unit 302 writes the data stored in the erasure-block buffer 103 into the erased erasure-unit region of the flash memory 101.

Steps S101 to S105 are performed every time a write request is issued.

Next, recovery processing will be described. In the event that the supply of power to the data processing device 100 is interrupted during the period that the data stored in the flash memory 101 is erased until new data is rewritten into the flash memory 101. Provided that the data, that has not finished being written into the flash memory 101, still exist in the erasure-block buffer 103 of the nonvolatile memory 102.

Next, the processing required for rewriting. The data pertaining to the erasure-block buffer 103 after power restoration, into the flash memory 101 will be described.

First, ordinary recovery processing will be described.

In step S105, the write controller 111 issues an instruction for erasing data from the flash memory 101. Then the number assigned to the erasure unit of the flash memory 101 contained in the erasure instruction is recorded into the erasure-unit-number hold region 202, which is located in the nonvolatile memory 102.

The write controller 111 nullifies the erasure unit number recorded in the erasure-unit-number hold region 202 upon completion of writing the data into the flash memory 101.

Next, the recovery processing will be described. Recovery processing is required in the event that the supply of power to the data processing device is interrupted during the time period that data is erased from the flash memory 101 until new data is written into the flash memory 101.

After the power supply is interrupted and the power is restored, the write control unit 111 ascertains the erasureunit-number hold region 202 located in the nonvolatile memory 102. If a valid erasure unit number exists in the erasure-unit-number hold region 202, the write controller 111 determines that the writing of data has not been completed. The data recorded in the erasure-block buffer 103 is written into the flash memory 101. The number assigned to the erasure unit in the flash memory 101, into which the data recorded in the erasure-block buffer 103 was to be written, is recorded in the erasure-unit-number hold region 202. Subsequently, the erasure unit number recorded in the erasure-unit-number hold region 202 is invalidated. If an effective erasure unit number does not exist in the erasure-unit-number hold region 202, data is not written into the flash memory 101, and recovery processing is terminated.

Through the foregoing processing operation, data can be recovered in the event that the supply of power to the data processing device is interrupted.

As has been previously described, the data pertaining to the erasure unit of the flash memory 101 to be rewritten are saved in the erasure-block buffer region 103 of the nonvolatile memory 102. Loss of data is prevented even if the supply of power to the data processing device is interrupted during the time period from when data is erased from the flash memory 101 until prior to the completion of writing new data into the flash memory 101. There is provided in the present embodiment, a data processing device, which exhibits excellent reliability in terms of rewriting data stored in the flash memory.

After the write data has been written into the erasure-block buffer 103 in step S103, non-changing data is saved in step S104. However, these operations may be performed in a reversed sequence. Alternatively, in a case where the write data is written into the erasure-block buffer 103 after the data has been saved into the save unit 112, not only the non-changing data but all the data pertaining to the erasure unit containing the non-changing data may be saved, and write data may be written over the thus-saved data.

In the first embodiment, the write data is written into the erasure-block buffer 103 in step S103. However, it is essential only that the write data be written into the erasure-block buffer 103 at least before the write means 302 writes the data stored in the erasure-block buffer 103 into the erasure-unit region of the flash memory 101.

In step S102, the number assigned to the erasure unit containing the write request region and the position in the erasure unit corresponding to the write request region is calculated from the capacity of the erasure unit and the write request region. However, data pertaining to the number and the position may be contained in the write request data. In such a case, computation processing pertaining to step S102 may be omitted.

In the present embodiment, the flash memory 101 is an example of memory comprising a plurality of erasure-unit regions from which data are erased in predetermined units or into which data are written in predetermined units. The erasure unit (not shown) of the flash memory 101 is an example of erasing the data, recorded in the erasure-unit region, in erasure units. The battery backup SRAM 102 is an example of a nonvolatile erasure-block buffer, wherein data can be written in arbitrary units. The write controller 111 writes write data into the erasure-block buffer 103. The save unit 112 saves non-changing data into the erasure-block buffer. The write unit 302 writes write data and non-changing data into the erasure-unit region.

Second Embodiment

Figure 4:
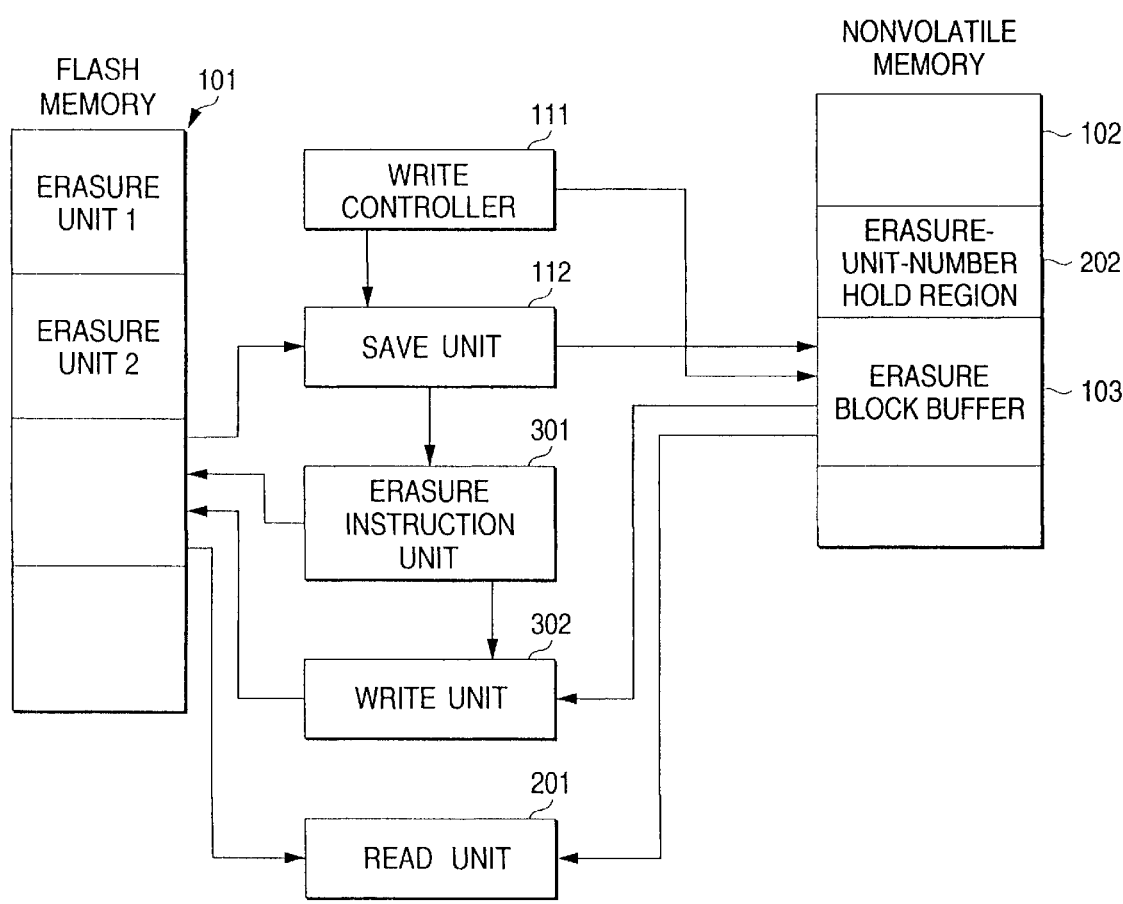
FIG. 4 is a block diagram showing a data processing device according to a second embodiment of the present invention.

FIG. 4 is a block diagram of a data processing device 200 according to a second embodiment of the present invention. In the drawing, reference numeral 201 designates a read unit for reading data from the flash memory 101 or the nonvolatile memory 102. 202 designates an erasure-unit number hold region, which is an area within the nonvolatile memory 102, and records an erasure unit number. In other respects, the data processing device is identical with or corresponds to that described with reference to FIG. 1, and hence repetition of explanation is omitted. The read unit 201 is effected through the processor 181 performing (executing) software operations.

The operation of the data processing device 200, wherein data is consecutively written into a single erasure-unit region, will be explained in the second embodiment.

Figure 5:
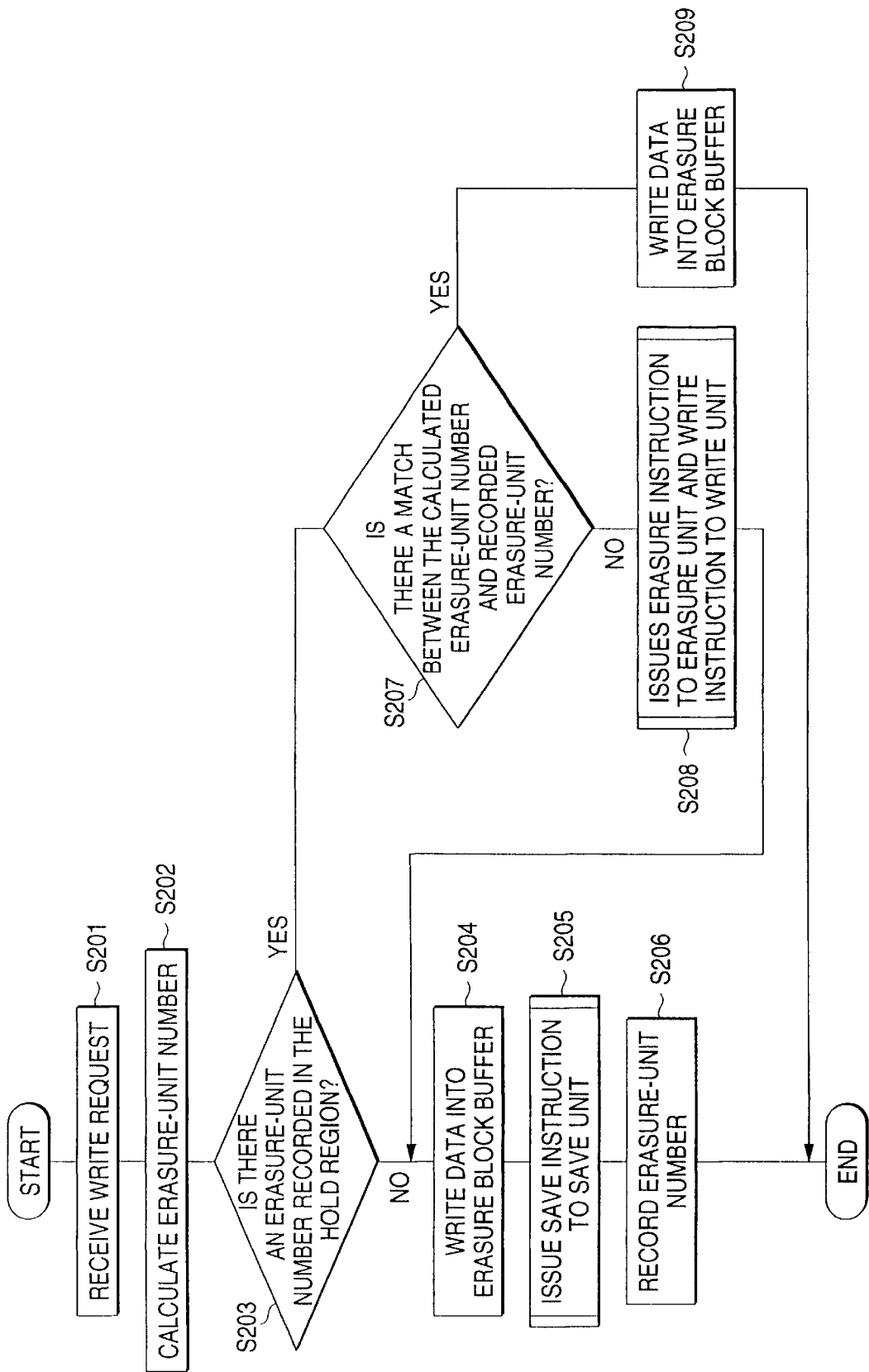
FIG. 5 is a flowchart showing the operation of the data processing device of the second embodiment for rewriting data stored in flash memory.

The operation of the data processing device 200 when data is written into memory will be described next with reference to FIG. 5. Here, the term "memory" designates a concept comprising both the flash memory 101 and the nonvolatile memory 102. Unless otherwise specified, the write controller 111 performs the following processing operations.

In step S201, the write controller 111 receives a request for writing data into the flash memory 101. The details of the data write request are the same as those of the data write request described in the first embodiment.

In step S202, the write controller 111 calculates a number assigned to the erasure unit of the flash memory containing the write request region. The method of determining the number of the erasure unit is the same as that described in connection with the first embodiment.

In step S203 a determination is made as to whether or not an erasure unit number is recorded in the erasure-unit number-hold region 202.

If the erasure number is not recorded, write data is written into the erasure-block buffer 103 in step S204, in the same manner as in the first embodiment.

In step S205, the write controller 111 issues a save instruction to the save unit 112. The details of the save instruction are the same as those of the save instruction employed in the first embodiment. The save unit 112 writes into the erasure-block buffer 103 the non-changing data stored in the erasure unit of the flash memory 101, the number of the erasure unit being determined in step S202.

In step S206, the number of the erasure unit determined in step S202, is recorded in the erasure-unit-number hold region 202. Subsequently, writing of data into the memory is terminated without writing data into the flash memory 101.

When, in step S203, the erasure unit number is determined to be recorded in the erasure-unit-number hold region 202, a determination is made, in step S207 as to whether or not the erasure unit number determined in step S202 matches the erasure unit number recorded in the erasure-unit-number hold region 202.

If no match is determined to exist, in step S208 the write controller 111 issues an erasure instruction to the erasure instruction unit 301. The details of the erasure instruction are the same as those of the erasure instruction employed in the first embodiment. Upon receipt of the erasure instruction, the erasure instruction unit 301 issues to the erasure means of the flash memory 101 an instruction for erasing data from an erasure unit in the flash memory 101, the erasure unit having a number corresponding to the erasure unit number. After the erasure process of the flash memory 101 has finished erasing data from the erasure unit, the write unit 302 writes into the erasure-unit region of the flash memory 101 the data stored in the erasure-block buffer 103.

Processing pertaining to steps S204 to S206 are performed in the same manner as when the erasure unit number is not recorded. Subsequently, the following steps are performed: data is written into the erasure-block buffer; the data recorded in the flash memory is saved; and the erasure-unit number is recorded.

In a case where in step S207 a match is determined to exist between the erasure unit number determined in S202 and the erasure unit number recorded in the erasure-unit-number hold region 202, the write request data, in step S209, is written into the erasure-block buffer 103.

As described above, in a case where the erasure unit number is not recorded, processing pertaining to steps S201 to S206 is performed. In a case where the erasure unit number is recorded, processing pertaining to steps S201 to S203, S207, S208, and S204 to S206 is performed in the sequence given. Alternatively, processing pertaining to steps S201 to S203, S207, and S209 is performed in the sequence given. More specifically, in a case where the first request corresponds to a write request, processing pertaining to steps S201 to S206 is performed in the sequence given. In response to a second or subsequent write request, processing pertaining to steps S201 to S203, S207, S208, and S204 to S206 are performed in the sequence given. Alternatively, processing pertaining to steps S201 to S203, S207, and S209 are performed in the sequence given. These processing operations are performed every time a write request is issued.

Figure 6:
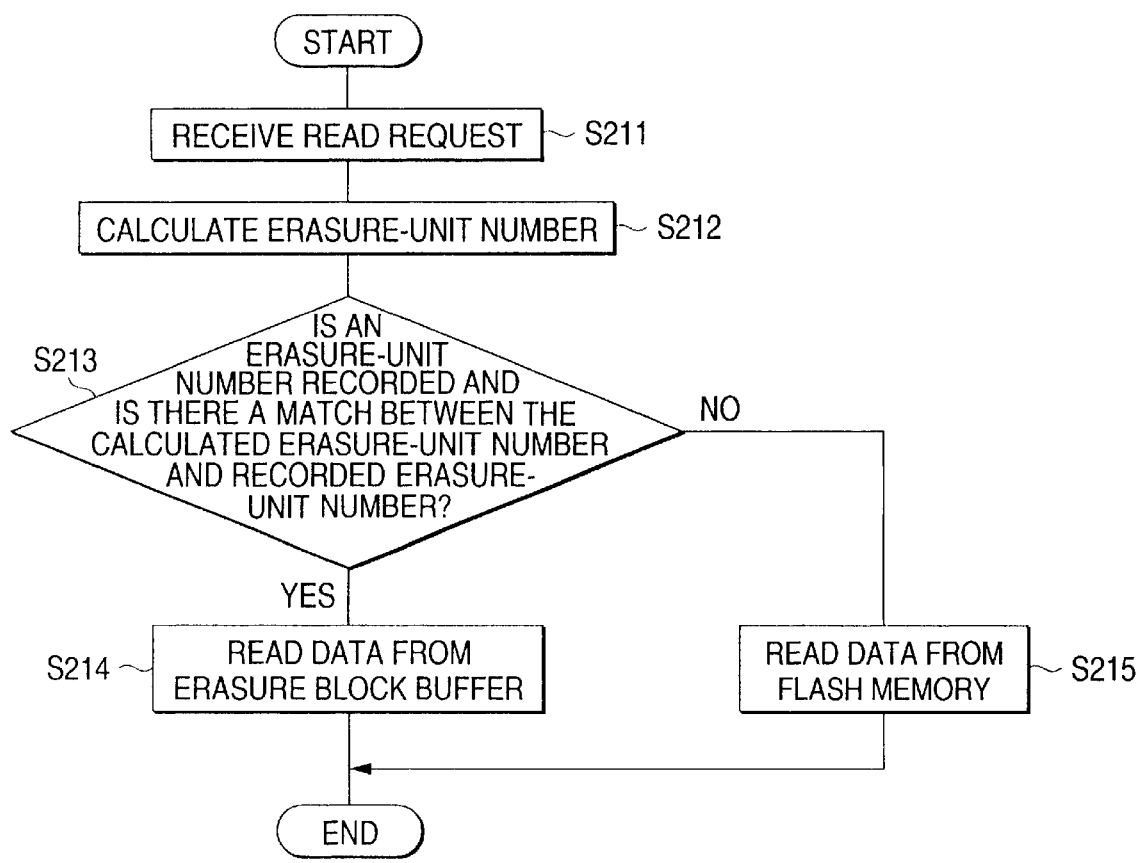
FIG. 6 is a flowchart showing the operation of the data processing device of the second embodiment for reading data from the memory.

The operation of the data processing device of the second embodiment at the time of reading data from the memory will now be described with reference to FIG. 6. Unless otherwise specified, the read unit 201 performs the following processing operations.

In step S211, the read unit 201 receives a read request. The read request contains an address of the flash memory 101 serving as a read request region and as data pertaining to the size of data to be read.

In step S212, the number assigned to the erasure unit of the flash memory 101 containing the read request region is determined in the same manner as in the case where the data is written. Here, the term "read request region" used herein designates an area of the flash memory 101 data to be read is stored, and specifies a relative position on the flash memory 101.

In step S213, a determination is made as to whether or not an erasure unit number is present and whether or not the erasure unit number is identical with that obtained in step S212, by reference to the erasure-unit-number hold region 202.

If a match exists between the erasure unit numbers, the data recorded in the read region is retained in the erasure-block buffer. Hence, in step S214, the data is read from the erasure-block buffer.

If an erasure unit number is not present in the erasure-unit-number hold region 202 or if no match exists between the erasure unit number recorded in the erasure-unit-number hold region 202 and the erasure unit number determined in step S212, the data recorded in the read region is not retained in the erasure-block buffer. Hence, in step S215, the data is read from the flash memory 101.

As mentioned above, in the second embodiment, in a case where data is written into a single erasure-unit region of the flash memory, after the first write data has been written into the erasure-block buffer, the second write data is written over the data that has already been recorded in the erasure-block buffer, without writing into the flash memory the data recorded in the erasure-block buffer. In a case where data is continuously written into a single erasure-unit region, the foregoing processing operations are performed consecutively. By virtue of such operations of the data processing device, in addition to yielding the advantage achieved in the first embodiment, the present embodiment can yield an advantage of preventing deterioration of flash memory by collectively and consecutively writing data into a single erasure-unit region of the flash memory, to thereby diminish the number of times data is written in the flash memory.

Even in the second embodiment, a recovery operation can be performed in the event of interruption of the power supply, as in the first embodiment. In this case, the record of an erasure unit number may be used as a not-yet-completed flag. This flag can be embodied by nullification of an erasure unit number after data has been written into the flash memory.

In step S205, a saving operation is performed to write into the erasure-block buffer 103 the non-changing data stored in the erasure-unit region of the flash memory 101. It is only essential that the saving operation be performed before the non-changing data is written into at least the flash memory 101. Further, it is only essential that the writing of write request data into the erasure-block buffer in step S204 be performed before the next write request data is written into the erasure-block buffer.

Third Embodiment

A data processing device according to a third embodiment of the present invention will now be described. As shown in FIG. 4, the data processing device is identical with that of the second embodiment in terms of configuration and operation. In the present embodiment, after data has been saved from the erasure-unit region of the flash memory 101, the data is erased from the erasure-unit region.

Figure 7:
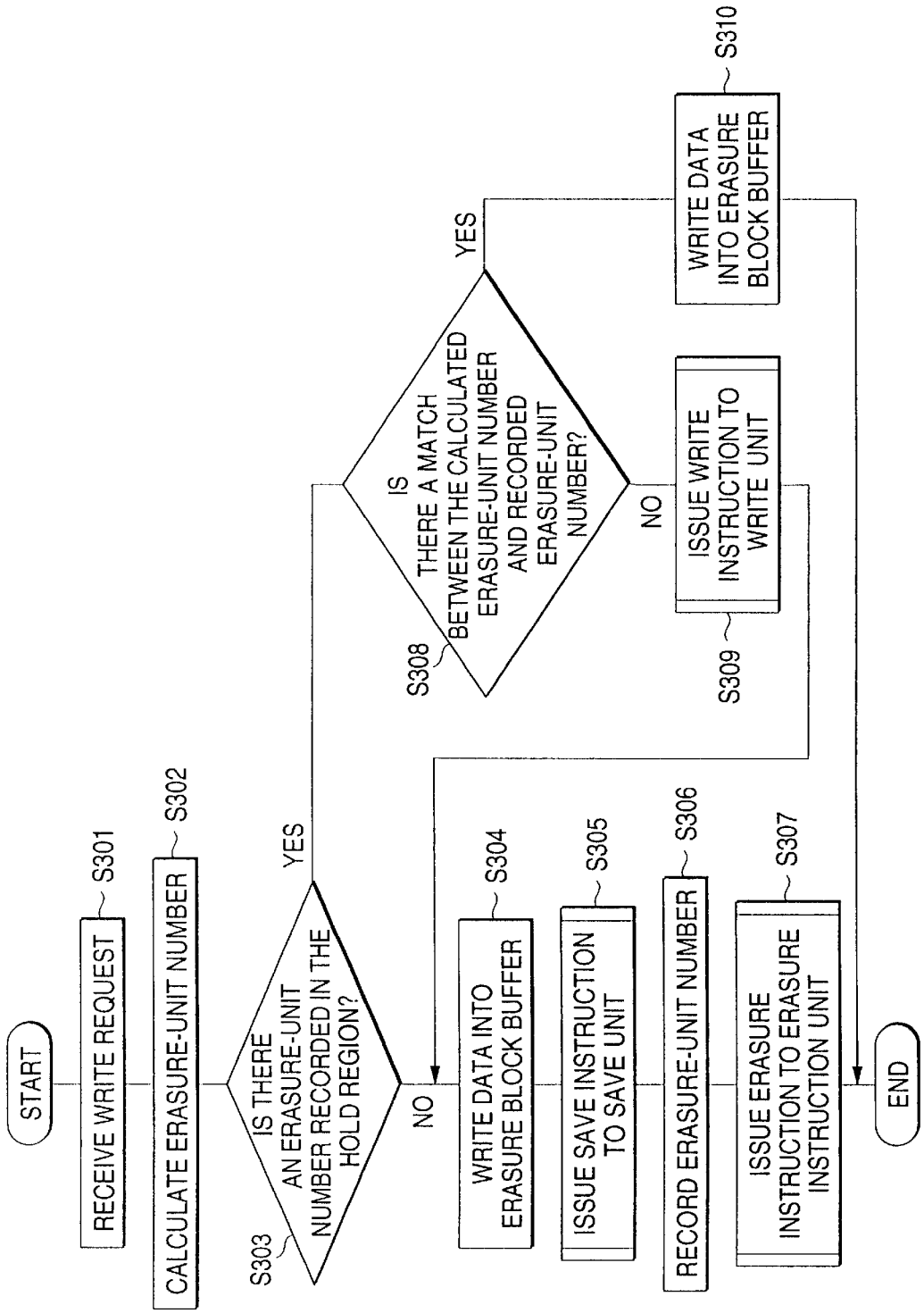
FIG. 7 is a flowchart showing the operation of a data processing device of a third embodiment for rewriting data stored in flash memory.

The operation of the data processing device of the third embodiment performed at the time of writing data into memory will now be described with reference to FIG. 7. Unless otherwise specified, the write controller 111 performs the following operation.

In step S301, the write controller 111 receives a data write request, and the details of the data write request are the same as the data write request of the first embodiment.

In step S302, a number assigned to the erasure-unit region of the flash memory 101 containing the write request region is determined. The method of determining the number assigned to the erasure-unit region is the same as in the first embodiment.

In step S303, a determination is made as to whether or not the erasure unit number is recorded, by reference to the erasure-unit-number hold region 202.

If in step S303 an erasure unit number is determined not to be recorded in the erasure-unit-number hold region 202, the write request data are written into the erasure block buffer 103U, in step S304.

In step S305, the write controller 111 issues a save instruction to the save unit 112, and the details of the save instruction are the same as those employed in the first embodiment. Upon receipt of the save instruction, the save unit 112 saves into the erasure block buffer 103 the non-changing data stored in the erasure-unit region.

In step S307, the write controller 111 issues an erasure instruction to the erasure instruction unit 301. The erasure instruction contains information about the erasure unit number determined in step S301. Upon receipt of the erasure instruction, the erasure instruction unit 301 issues an instruction for erasing the data from the erasure-unit region whose data has finished being saved into the erasure block buffer in step S305.

In a case where in step S303 an erasure unit number is determined to be recorded in the erasure-unit-number hold region 202, a determination is made in step S308 as to whether or not a match exists between the erasure unit number determined, or calculated, in step S302 and the erasure unit number recorded in the erasure-unit number hold region 202.

If no match is determined to exist between the erasure unit numbers, in step S309 a write instruction is issued to the write unit 302. The write instruction contains information about the erasure unit number. Upon receipt of the write instruction, the write unit 302 writes into the flash memory 101 the data pertaining to the current erasure block buffer 103. The data recorded in the erasure-unit region of the flash memory 101 has already been erased in the previous write operation (S307). Hence, the data recorded in the erasure block buffer 103 is written into the erasure unit region from which data have already been erased. In subsequent steps, as in the case where no erasure unit number is recorded, processing pertaining to steps S304 and S307 are performed.

If in step S308 a match is determined to exist between the erasure unit numbers, the data recorded in the unit erasure region into which the write request data are to be written has already been recorded in the erasure block buffer 103. Therefore, in step S310 the write request data is written into the erasure block buffer 103.

The operation of reading data from the memory is similar to the operation, at the time of reading data from the memory, as described in the second embodiment.

The foregoing processing is executed every time the write request is issued.

The data is erased from the flash memory after having been saved. At the time of writing the data stored in the erasure block buffer into the flash memory, there is no necessity for performing a processing operation of erasing data from the flash memory. Since flash memory erases data, as if the erasure were performed by hardware, the processor can perform another processing operation in parallel. For instance, the processor writes data into the main storage device by way of the I/O interface or performs arithmetic processing in parallel.

In a case where data is erased from the flash memory at the time of writing data into the flash memory, the processor has already received the write request, and hence the processor must await erasure processing and cannot perform another processing operation in parallel.

As mentioned above, in the third embodiment, after having been saved, the data is erased from the flash memory. Hence, there is eliminated a necessity for erasing data from flash memory at the time of writing data into the flash memory. In addition to yielding the advantage achieved in the second embodiment, the present embodiment can yield an advantage of shortening the time required for effecting write processing. Further, the processor can perform processing in parallel with erasure of data from the flash memory, thus improving the processing speed of the data processing device.

Fourth Embodiment

Figures 8, 9:
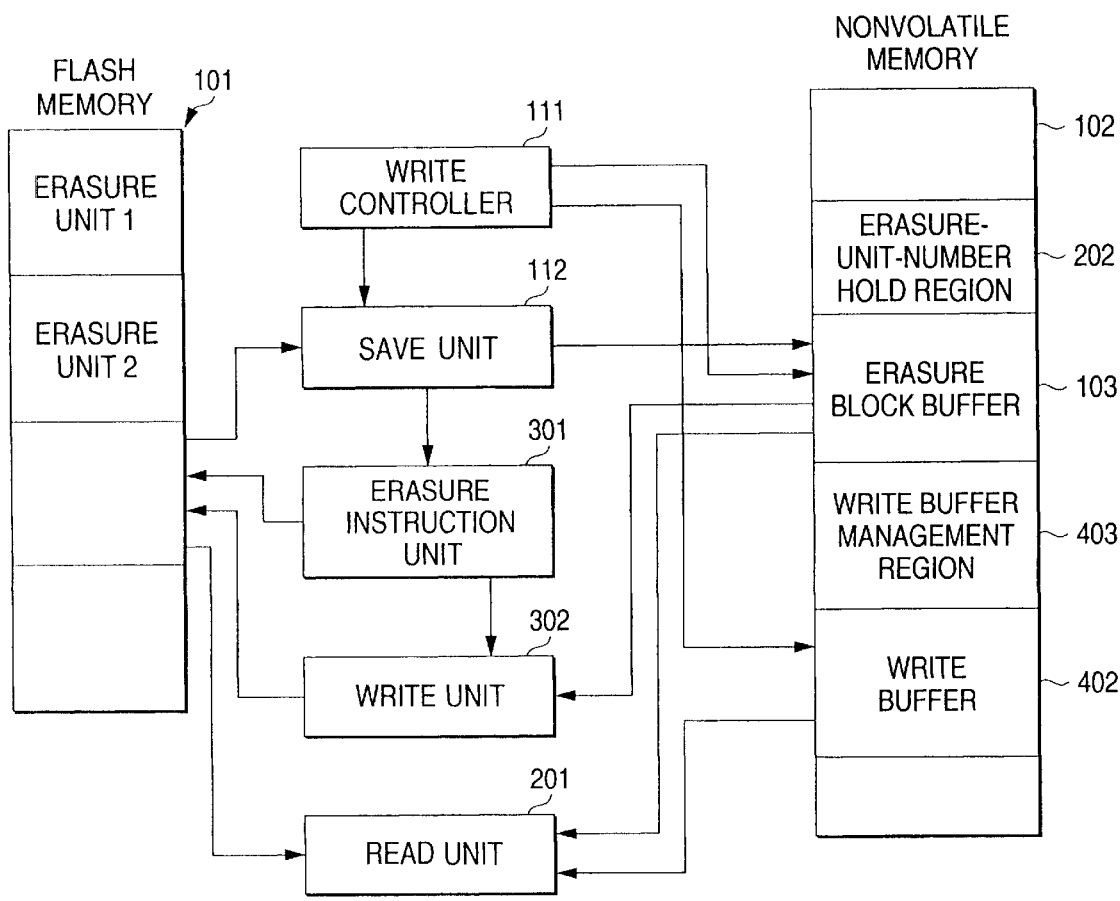
FIG. 8 is a block diagram showing a data processing device according to a fourth embodiment of the present invention.
FIG. 9 is a table showing the contents of data recorded in a write buffer management region.

FIG. 8 is a block diagram showing the configuration of a data processing device 400 according to a fourth embodiment of the present invention. In the drawing, reference numeral 402 designates a write buffer which records write data and is located in the nonvolatile memory 102 from which data can be read in arbitrary units or into which data can be written in arbitrary units. The write buffer 402 records write data and does not record non-changing data. Reference numeral 403 designates a write buffer management region. An erasure unit number, an offset value for specifying the position of a write region in the erasure unit region, and a data size, are stored in the write buffer management region 403. In other respects, the data processing device is identical with or corresponds to that shown in FIG. 3 in terms of configuration, and hence repetition of its explanation is omitted here.

FIG. 9 is a table showing the details of the data recorded in the write buffer management region 403. The write buffer management region 403 retains a number assigned to the erasure unit region of the flash memory 101 into which the data retained in the write buffer 402 is to be written, an offset value for specifying the location of the write region in the erasure unit region, and data pertaining to the size of the write region. A value of −1 assigned to the erasure unit region signifies that no write data exist in the erasure unit region. Although in the present embodiment the write region has a uniform size, the size of the write region can be changed from one data set to another data set.

Figure 10:
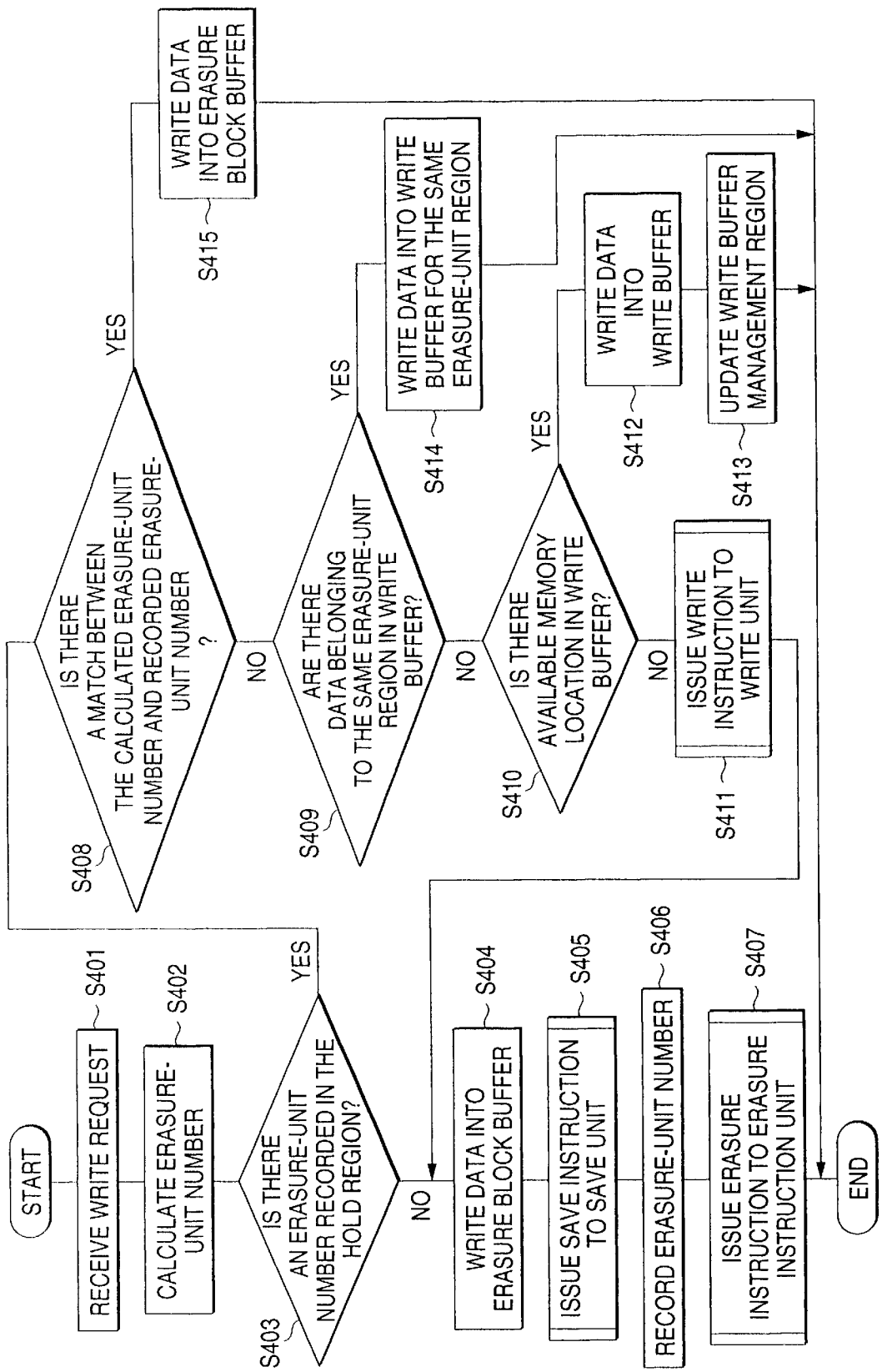
FIG. 10 is a flowchart showing the operation of a data processing device of a fourth embodiment for rewriting data stored in flash memory.

The operation of the data processing device of the fourth embodiment performed at the time of writing data into memory will now be described by reference to FIG. 10. Unless otherwise specified, the write controller 111 performs the following processing operations.

In step S401, the write controller 111 receives a data write request, and the details of the data write request are the same as those of the data write request employed in the first embodiment.

In step S402, a number assigned to the erasure-unit region of the flash memory containing the write request region is determined, or calculated. The operation of the data processing device required for determining the number is the same as in the first embodiment.

In step S403, a determination is made as to whether or not the erasure unit number assigned to the erasure-unit region is recorded.

If the erasure unit number is not recorded, in step S404, the write controller 111 writes write request data into the erasure block buffer 103.

In step S405, the write controller 111 issues a save instruction to the save unit 112. The details of the save instruction are the same as those of the save instruction employed in the first embodiment. Upon receipt of the save instruction, the save unit 112 writes into the erasure block buffer 103, the non-changing data recorded in the erasure-unit region specified by the erasure unit number calculated in step S402.

In step S406, the erasure unit number calculated in S402 is recorded in the erasure-unit-number hold region 202.

In step S407, the write controller 111 issues an erasure instruction to the erasure instruction unit 301. The details of the erasure instruction are the same as those of the erasure instruction employed in the second embodiment. Upon receipt of the erasure instruction, the erasure instruction unit 301 issues, to the flash memory 101, an instruction for erasing the data from the erasure unit region whose data has already finished being saved to the erasure block buffer 103.

In a case where in step S403 the erasure unit number is determined to be recorded in the erasure-unit-number hold region 202, a determination is made in step S408 as to whether or not the erasure unit number determined in step S402 matches the erasure unit number recorded in the erasure-unit-number hold region 202.

If in step S408 no match is determined to exist between the erasure unit numbers, a determination is made in step S409 as to whether or not the data to be written into an area is identical with the write request region which are already present in the write buffer 402, on the basis of the data recorded in the write buffer management region 403. Such a determination can be ascertained on the basis of the erasure unit number, the offset value for specifying the position of a write region in the erasure unit region, and the data pertaining to the size of the write region, which is stored in the write buffer management region 403. In other words, in step S409 a determination is made as to whether or not the area specified by the write request region is contained in the write request region relating to the data that has already been recorded in the write buffer 402. In either of the following two cases, the area specified by the write request region is determined to be contained in the write request region relating to the data which has already been recorded in the write buffer 402. In one case, the area specified by the write request region is completely identical with the write request region relating to the data which has already been stored in the write buffer 402. In another case, the area specified by the write request region is contained in the write request region relating to the data which has already been stored in the write buffer 402.

If in step S409 the data to be written into an area identical with the write request region is determined not to exist in the write buffer 402, in step S410 the write controller 111 checks for available memory locations of the write buffer 402 as to whether or not the write buffer 402 has a memory location in which the write request data can be written. The presence of an available memory location can be ascertained on the basis of the data recorded in the write buffer management region 403. In the present embodiment, the presence of an available memory location can be recorded by assigning a value of −1 to the final erasure unit number. If the final erasure unit number assumes a value other than a value of −1, no available memory location is present in the write buffer 402. As a matter of course, a determination may be made as to whether or not the write buffer 402 has an available memory location, on the basis of the capacity of the write buffer 402 and the data pertaining to the size of the write data contained in management data.

If the write buffer 402 has no available memory location, the write controller 111 in step S411 issues a write instruction to the write unit 302. The details of the write instruction are the same as those of the write instruction employed in the first embodiment. Upon receipt of the write instruction, the write unit 302 writes into the flash memory 101 the data currently recorded in the erasure block buffer 103.

In the subsequent steps, processing pertaining to steps S404 to S407 is performed in the same manner as in the case where the erasure unit number is not recorded.

If in step S410 the write buffer 402 is determined to have an available memory location, write data is written into the write buffer 402, in step S412.

In step S413, the management data pertaining to the write data which is written in step S412, is recorded in the write buffer management region 403. The number assigned to the erasure-unit region, the offset value for specifying a location in the erasure-unit region, and the size of write data are recorded as the management data. The management data stored in the write buffer management region 403 is associated with the write data stored in the write buffer 402 by recording the management data and the write data in such a way that the data is assigned the same sequence in the address of each area. Alternatively, addresses in the write buffer, in which write data are recorded, may be recorded into the write buffer management region 403, thus making the management data associated with the write data.

If in step S409 the data to be written into the area identical with the write request region is determined to already exist, the write data is written in step S412, into the area of the write buffer in which the data is recorded.

In a case where in step S408 the erasure unit number calculated in step S402 is determined to match the erasure unit number recorded in the erasure-unit-number hold region 202, the write request data is written in step S415, into the erasure block buffer. The operation of the data processing device of the fourth embodiment performed at the time of writing the write request data into the erasure block buffer is the same as in the first embodiment.

Figure 11:
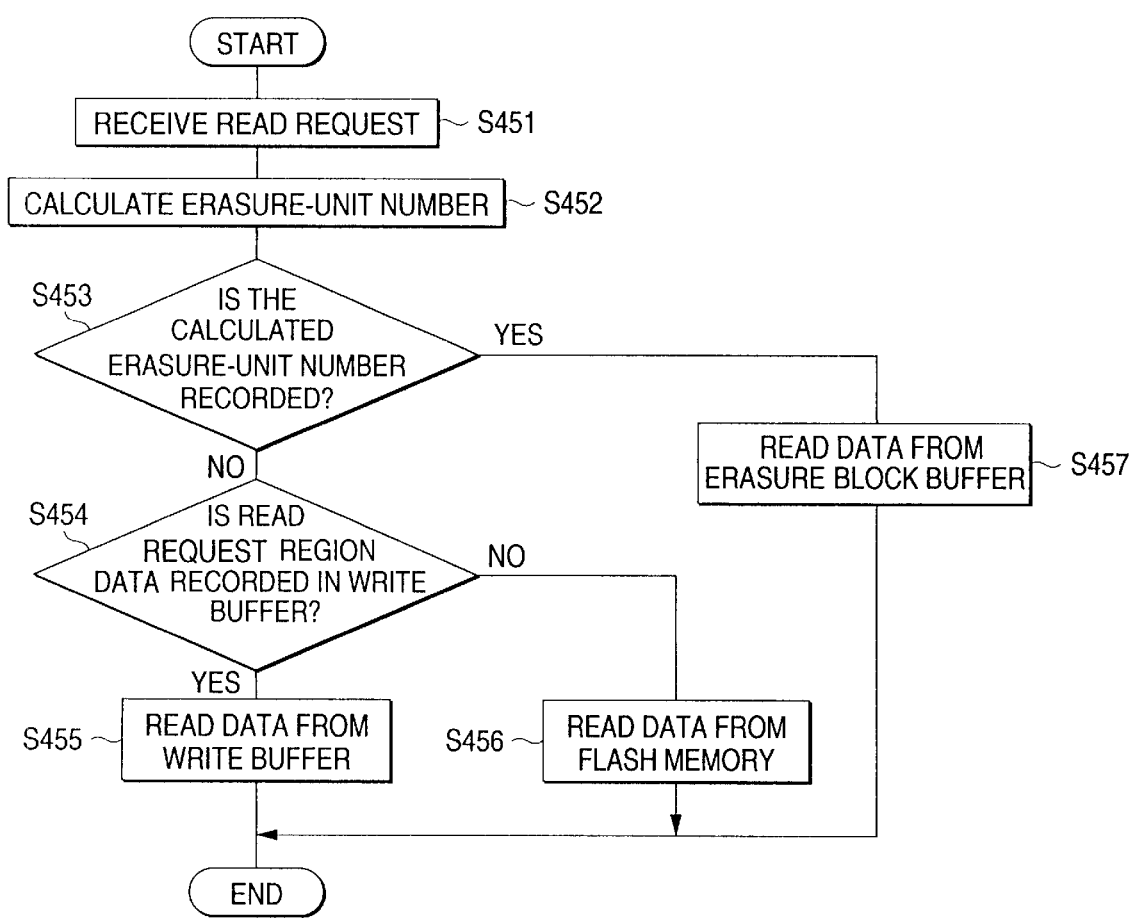
FIG. 11 is a flowchart showing the operation of the data processing device of the fourth embodiment for reading data from the memory.

The operation of the data processing device of the present embodiment performed at the time of reading data from memory will now be described with reference to FIG. 11. Unless otherwise specified, the read unit 201 performs the following operations.

In step S451, the read unit 201 receives a read request, and the details of the read request are the same as those of the read request employed in the second embodiment.

In step S452, the number assigned to the erasure-unit region of the flash memory containing the read request region is determined, or calculated. The operation of the data processing device required for calculating the number assigned to the erasure unit region is the same as in the second embodiment.

In step S453, a determination is made as to whether or not the erasure unit number is recorded in the erasure-unit region number hold region 202, by reference to the erasure-unit-number hold region 202.

If the erasure unit number is not recorded, a determination is made in step S454, as to whether or not the data to be written into the area specified as the read request region has already been recorded in the write buffer 402, by reference to the management data stored in the write buffer management region 403.

If the data to be written into the area specified as the read request region is recorded in the write buffer 402, the data is read from the write buffer 402 in step S455.

In contrast, if the data to be written into the area specified as the read request region is not recorded in the write buffer 402, the read data is read from the flash memory 101 in step S456.

If in step S453 the erasure unit number is determined to be recorded in the erasure-unit-number hold region 202 and if in step S454 the erasure unit number is determined to match the erasure unit number calculated in step S452, the data stored in the read region is retained in the erasure block buffer 103, and hence in step S457 the read data is read from the erasure block buffer 103.

The foregoing processing operations are executed every time the write request is issued.

In the present embodiment, in addition to the erasure block buffer 103, the write buffer 402 for recording write data is provided in the nonvolatile memory 102. Hence, a plurality of write data sets can be recorded in different erasure-unit regions. In addition to yielding the advantage achieved in the third embodiment, the present embodiment yields an advantage of diminishing the number of times data is written in the flash memory 101, to thereby reduce deterioration of the flash memory 101. Particularly, since the cost of battery backup SRAM per recording capacity is expensive, a strong demand exists for efficient utilization of the battery backup SRAM. As in the case of the present embodiment, in addition to the erasure block buffer 103, the write buffer 402 is provided as an area for recording write data without recording non-changing data. Therefore, in contrast with a data processing device having a plurality of erasure block buffers, the data processing device of the present invention can greatly diminish deterioration of the flash memory, by efficiently utilizing the nonvolatile memory 102.

In the present embodiment, the write buffer 402 is an example of a write buffer for storing write data without involvement of storage of non-changing data. The write controller 111 is an example of a data writer for writing first write data into the erasure block buffer in response to a first write request for requesting writing of the first write data into a first erasure unit region. The write controller 111 is also an example of a buffer writer for writing second write data into the write buffer in response to a second write request for requesting writing of the second write data into a second erasure unit region. In the fourth embodiment, the write controller 111 acts as both the data writer and the buffer writer. The save unit 112 is for writing into the erasure block buffer the non-changing data recorded in the first erasure unit region, in response to the first write request for requesting writing of first write data into the first erasure unit region.

Fifth Embodiment

Figure 12:
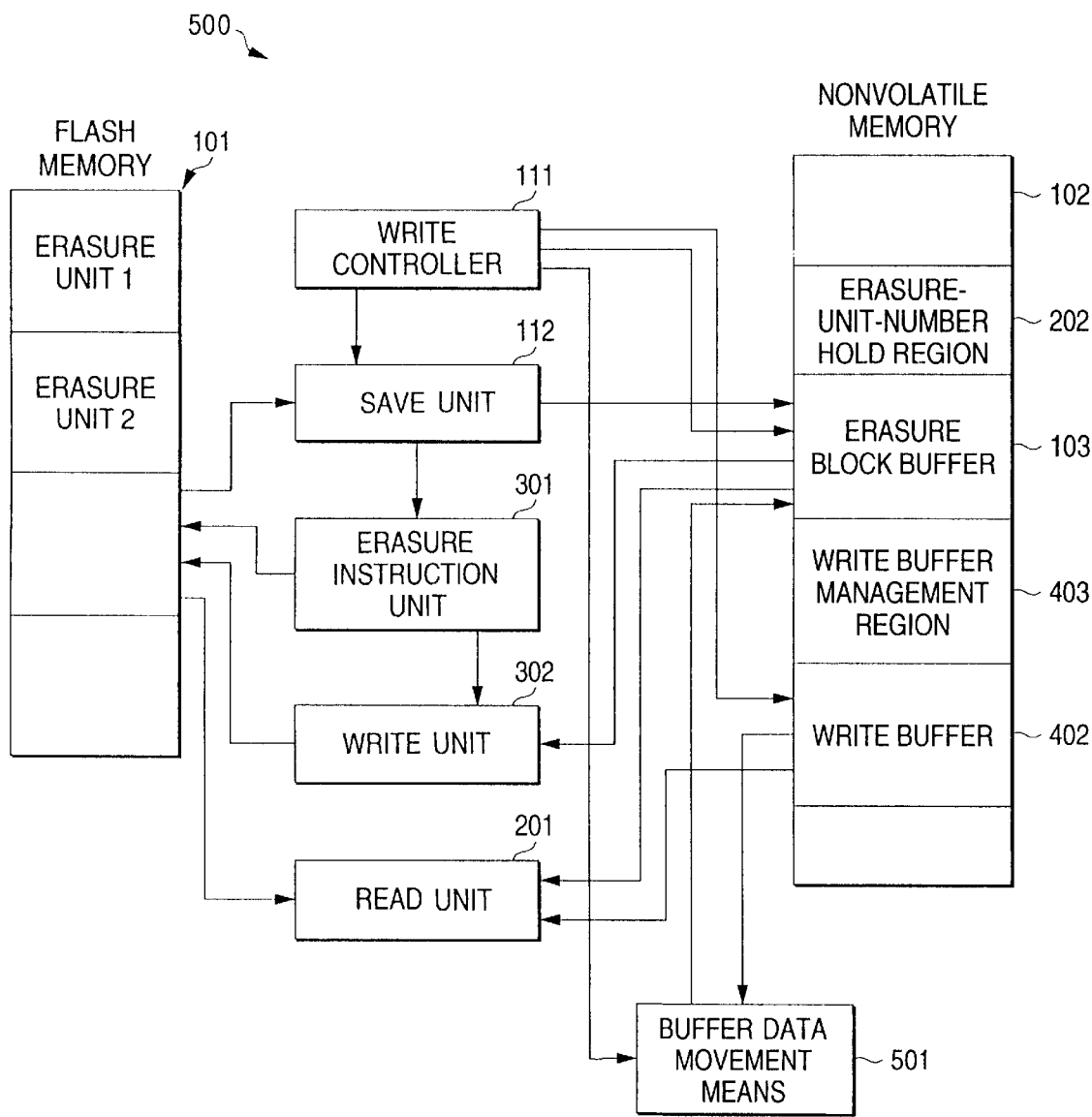
FIG. 12 is a block diagram showing a data processing device according to a fifth embodiment of the present invention.

FIG. 12 is a block diagram showing the configuration of a data processing device 400 according to a fifth embodiment of the present invention. In the drawing, reference numeral 501 designates buffer-data movement unit for moving the data recorded in the write buffer 402. In other respects, the data processing device is identical with or corresponds to that described in connection with the fourth embodiment, and hence repetition of explanation is omitted. The data processing device of the fifth embodiment is basically identical in operation with that described in connection with the fourth embodiment, but the processing devices differ from each other in that the buffer-data movement unit 501 moves to the erasure block buffer 103, the data recorded in a single erasure-unit region within the write buffer 402.

The operation of the data processing device of the fifth embodiment performed at the time of writing data will now be described, by reference to FIGS. 13 and 14. Unless otherwise specified, the write controller 111 performs the following processing operations.

In step S501, the write controller 111 receives a data write request, and the details of the data write request are the same as those of the data write request employed in the first embodiment.

A number is determined, or calculated, in step S502, which is assigned to the erasure-unit region of the flash memory containing the write request region. The operation of the data processing device required for determining the number is the same as in the first embodiment.

In step S503, a determination is made as to whether or not the number assigned to the erasure-unit region is recorded, by reference to the erasure-unit-number hold region 202.

If the number assigned to the erasure unit region is not recorded, in step S504, the write controller 111 writes write data into the erasure block buffer 103.

In step S505, the write controller 111 issues a save instruction to the save unit 112. The details of the save instruction are the same as those of the save instruction employed in the first embodiment. Upon receipt of the save instruction, the save unit 112 writes non-changing data into the erasure block buffer 103 as a saving processing operation.

In step S506, the erasure unit number calculated in S502 is recorded in the erasure-unit-number hold region 202.

In step S507, the write controller 111 issues an erasure instruction to the erasure instruction unit 301. The details of the erasure instruction are the same as those of the erasure instruction employed in the second embodiment. Upon receipt of the erasure instruction, the erasure instruction unit 301 issues, to the flash memory 101, an instruction for erasing the data from the erasure unit region whose data has already finished being saved to the erasure block buffer 103.

In a case where in step S503 the erasure unit number is determined to be recorded in the erasure-unit-number hold region 202, a determination is made in step S508, as to whether or not the erasure unit number determined in step S502 matches the erasure unit number recorded in the erasure-unit-number hold region 202.

If in step S508 no match is determined to exist between the erasure unit numbers, a determination is made in step S509, as to whether or not the data to be written into an area identical with the write request region is already present in the write buffer 402, by reference to the write buffer management region 403.

If in step S509 the data to be written into an area is identical with the write request region, is determined not to exist in the write buffer 402, a determination is made in step S510, as to whether or not the erasure unit number obtained in step S502 and the data assigned the same erasure unit number are present in the write buffer 402, by reference to the write buffer management region 403.

If in step S510 the data assigned the same erasure unit number are determined to be recorded in the write buffer 402, buffer data movement processing is performed, which will be described later.

If in step S510 the data assigned the same erasure unit number is determined not to be recorded in the write buffer 402, a determination is made in step S511, as to whether or not the write buffer 402 has a memory location into which write request data can be written.

If in step S511 the write buffer 402 is determined to have no available memory location, the write controller 111 in step S512, issues a write instruction to the write unit 302. Upon receipt of the write instruction, the write 302 writes into the flash memory 101 the data currently recorded in the erasure block buffer 103.

In the subsequent processes, processing pertaining to steps S504 to S507 is performed in the same manner as in the case where the erasure unit number is not recorded.

If in step S511 the write buffer 402 is determined to have an available memory location, the write controller 111 in step S513, writes write data into the write buffer 402.

In step S514, the number assigned to the erasure-unit region, the offset value for specifying a location in the erasure-unit region, and the size of write data are recorded as management data in the write buffer management region 403.

If in step S509 the data to be written into the area identical with the write request region are determined to exist in the write buffer 402, the write controller 111 in step S516, overwrites the write request data in an area where there exist the data to be written into the area identical with the write request region.

If in step S508 the erasure unit number calculated in step S502 matches the erasure unit number recorded in the erasure-unit-number hold region 202, the write request data in step S517 is written over an area within the erasure block buffer 103 where there is stored the data assigned the same erasure unit number as that assigned to the write request data.

By reference to FIG. 14, next will be described the operation of the data processing device 400 required for moving data from a buffer when in step S510 the data assigned the same erasure unit number are determined to be recorded in the write buffer 402. Unless otherwise specified, the write controller 111 performs the following operation.

In step S521, a write instruction is issued, and the data currently registered in the erasure block buffer 103 is written into the flash memory 101.

In step S522, the write request data is written into the erasure block buffer 103.

In step S523, the buffer-data movement unit 501 moves to the erasure block buffer 103 all the write data recorded in the same erasure unit region where the write request data are recorded, from among the data recorded in the write buffer 402. If the write request region relating to the write request data differs from the write request region relating to the write data which has already been recorded in the write buffer 402, the write request data and all the write data recorded in the write buffer 402 are stored in the erasure block buffer 103. If a partial overlap exists between the write request region relating to the write request data and the write request region relating to the write data which have already been stored in the write buffer 402, the write request data is written, in preference to the write data, into the erasure block buffer 103 with regard to the overlap. With regard to a non-overlapping area between the write request regions, the write request data and the write data stored in the write buffer 402 are written into the erasure block buffer 103.

In step S524, the write controller 111 issues a save instruction to the save unit 112. Upon receipt of the save instruction, the save unit 112 saves, from the erasure unit region of the flash memory, non-changing data which are other than the data written into the erasure block buffer 103 in step S523.

In step S525 the erasure unit number is recorded into the erasure-unit-number hold region 202, and in step S526 the write buffer management region 403 is updated in association with movement of the data from the write buffer 402 to the erasure block buffer 103.

Finally, in step S527, an erasure instruction is issued to the erasure instruction unit 301. Upon receipt of the erasure instruction, the erasure instruction unit 301 issues to the flash memory 101 an instruction for erasing the data of the erasure-unit region saved into the erasure block buffer 103.

The foregoing processing operations are performed every time the write request is issued.

The operation of the data processing device of the fifth embodiment performed at the time of reading data from memory is the same as in the fourth embodiment.

The data processing device of the fifth embodiment collects, into the erasure block buffer 103, the write data and the write request data recorded in the write buffer 403 contained in the single erasure unit region of the flash memory 101, thus enabling efficient use of the write buffer 402. In addition to yielding the advantage achieved in the fourth embodiment, the present embodiment yields an advantage of diminishing the number of times data is written to the flash memory 101, thereby reducing the deterioration of the flash memory 101.

In the present embodiment, a plurality of write data sets stored in the write buffer 402 may be moved instead of the write request data, or the write data recorded in the erasure unit region identical with that in which the write request data are stored. More specifically, a plurality of write data sets which are recorded in the write buffer 402 and are contained in a single erasure unit region may be moved.

Figure 13:
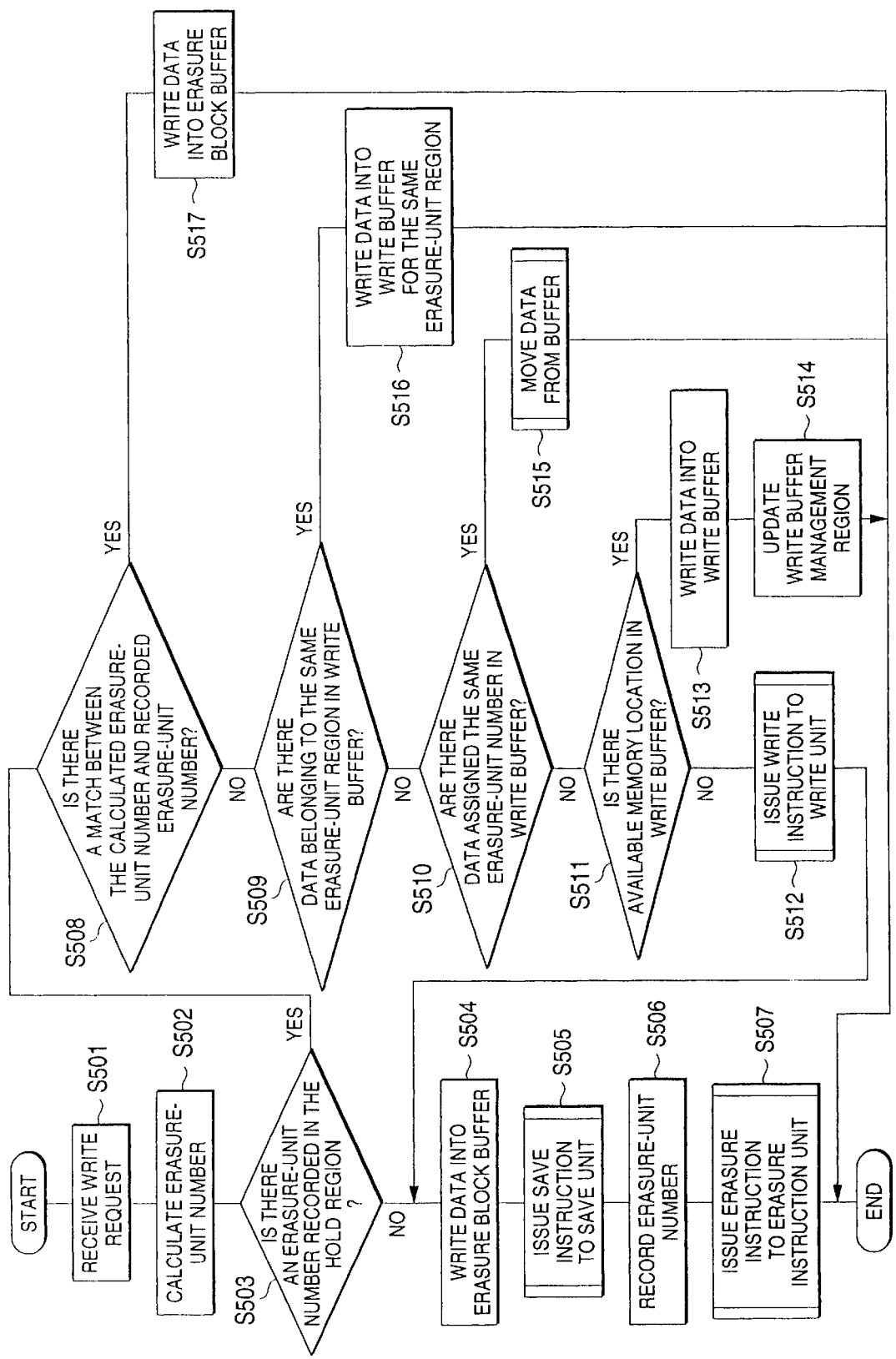
FIG. 13 is a flowchart showing the operation of a data processing device of the fifth embodiment for rewriting data stored in flash memory.
Figure 14:
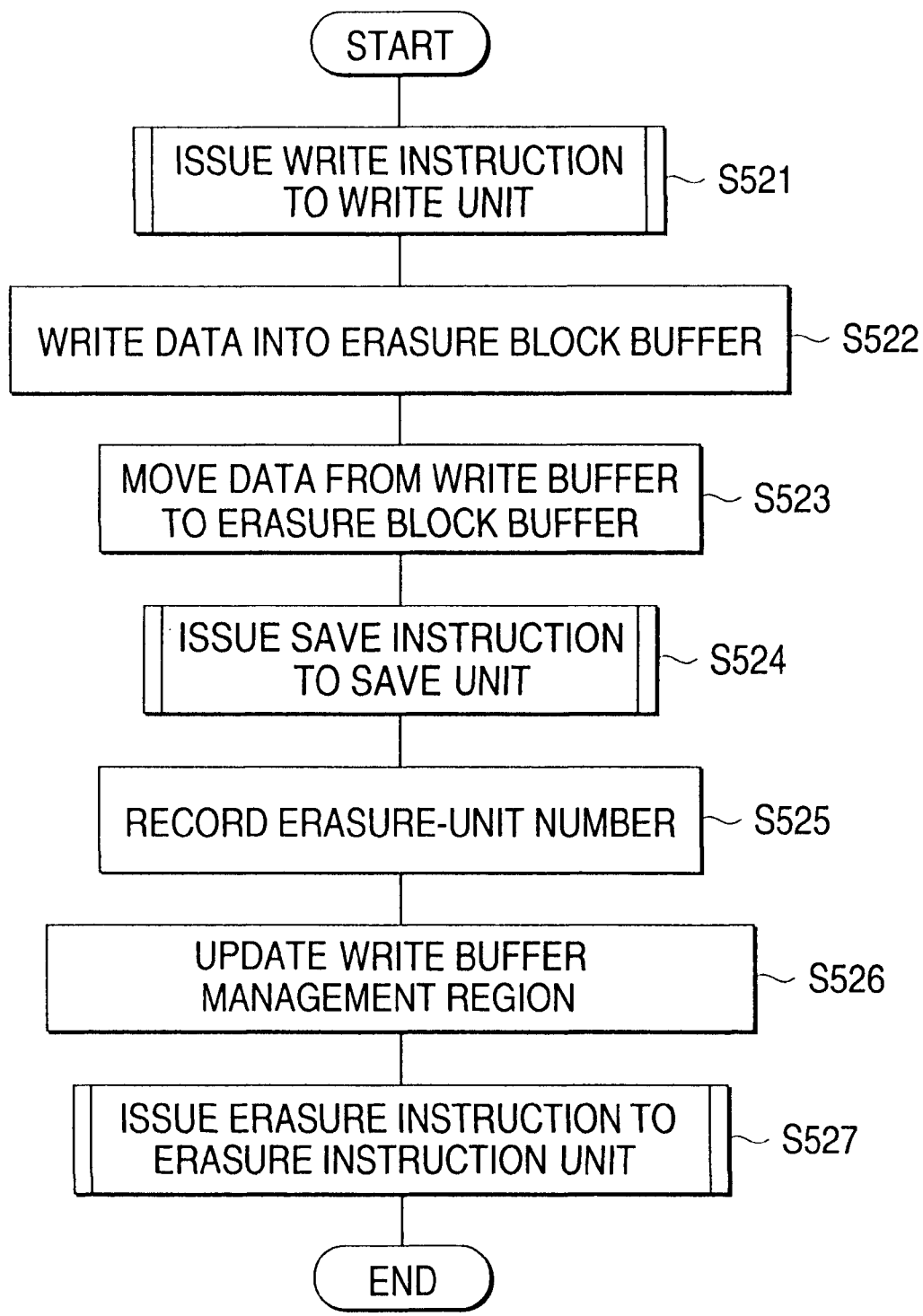
FIG. 14 is a flowchart showing the operation of the data processing device for performing buffer data movement processing pertaining to step S515 in FIG. 13.

In this case, in step S510 in FIG. 13 the write controller 111 determines the erasure-unit region which has the largest number of write data sets recorded in the write buffer 402, by reference to the write buffer management region 403. This determination can be made by reference to the erasure unit number stored in the write buffer management region 403.

If in step S510 the write data contained in the single erasure-unit region is determined not to exist in the write buffer 402, the processing proceeds to step S511.

If in step S510 the write data contained in the single erasure-unit region is determined to exist in the write buffer 402, in step S510 the erasure-unit region which has the largest number of write data sets is determined. In step S515, the plurality of write data sets recorded in the write buffer 402 are moved to the buffer.

Processing pertaining to steps S521 and S522 is not performed at the time of moving data from the write buffer 402. All the data sets to be written into the erasure unit region—which is determined to have the largest number of write data sets in step S510—are moved to the erasure block buffer 103 from the write buffer 402. If the write request regions of the write data differ from each other, all the data sets stored in the write buffer 402 are stored in the erasure block buffer 103. If a partial overlap exists between the write request regions relating to the write request data sets, new write data is written, in preference to the write data, into the erasure block 103 with regard to the overlap. After writing of data into the erase block buffer 103 has been completed, the data is erased from the area of the write buffer 402 in which the data that has been moved were stored.

Subsequently, the write request data is written into the write buffer 402 during a period between steps S525 and S526.

In step S526, the management data is updated on the basis of the new write data, and processing pertaining to step S527 is finally performed.

As mentioned above, the write data belonging to the erasure-unit region having the largest number of write data sets is moved to the erasure block buffer 103, thus enabling more efficient utilization of the nonvolatile memory 102.

Sixth Embodiment

A data processing device according to a sixth embodiment of the present invention is identical in configuration with that of the fifth embodiment. In the write buffer management region 403, there is recorded data pertaining to the frequency of use of the write buffer 402, as well as the data shown in FIG. 9. As shown in FIG. 15, counters or serial numbers are incremented by one, every time data is written into the write buffer 402 and specify the order in which data is written. The number of times data is written into the write buffer region 402 is recorded as an example of data pertaining to the frequency of use of the write buffer 402.

The data processing device of the present embodiment is basically identical in operation with that described in connection with the fifth embodiment. Particularly, written data is moved on the basis of frequency of use of the write buffer 402.

Figure 16:
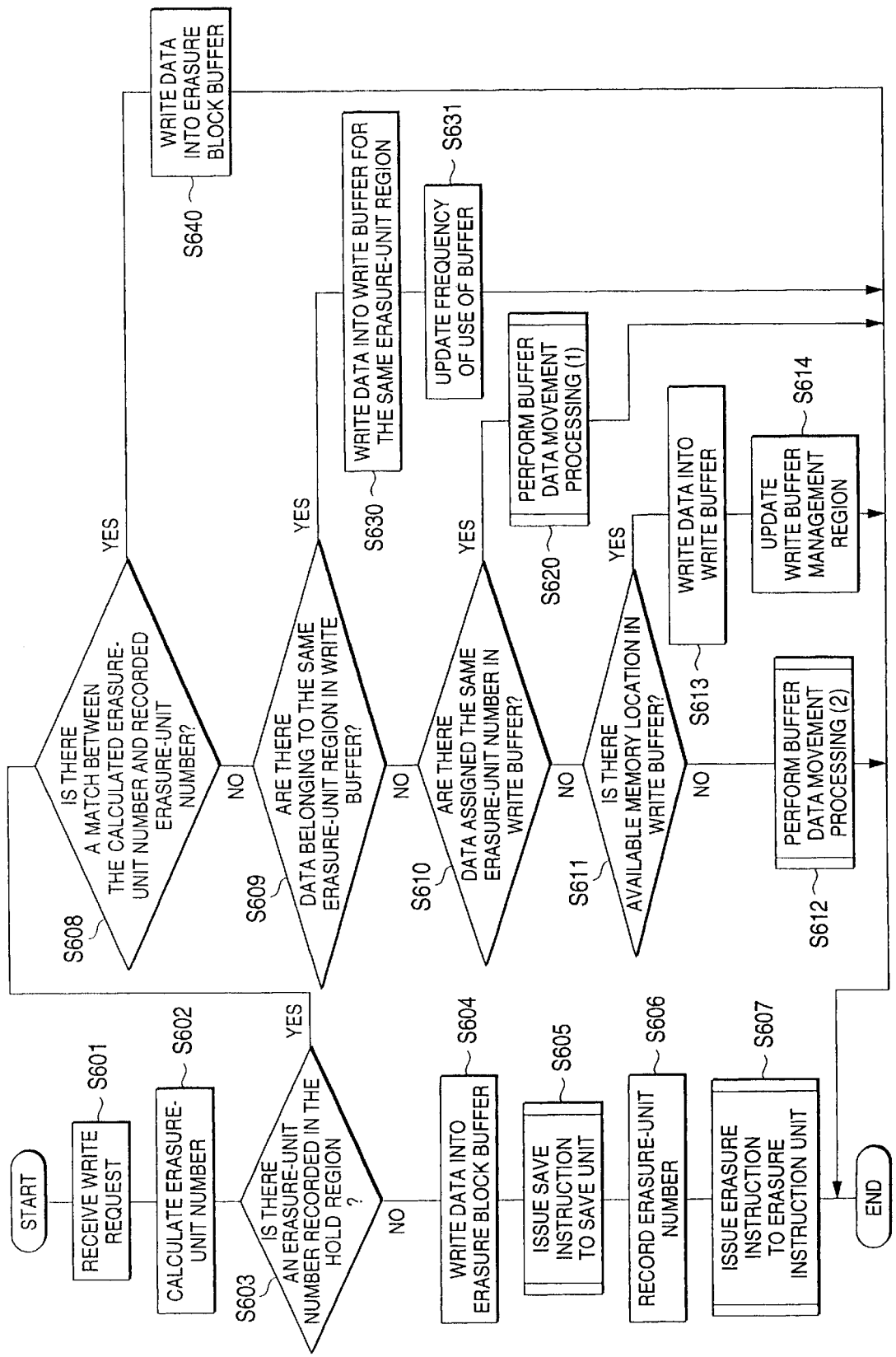
FIG. 16 is a flowchart showing the operation of a data processing device of a sixth embodiment for rewriting data stored in flash memory.
Figure 17:
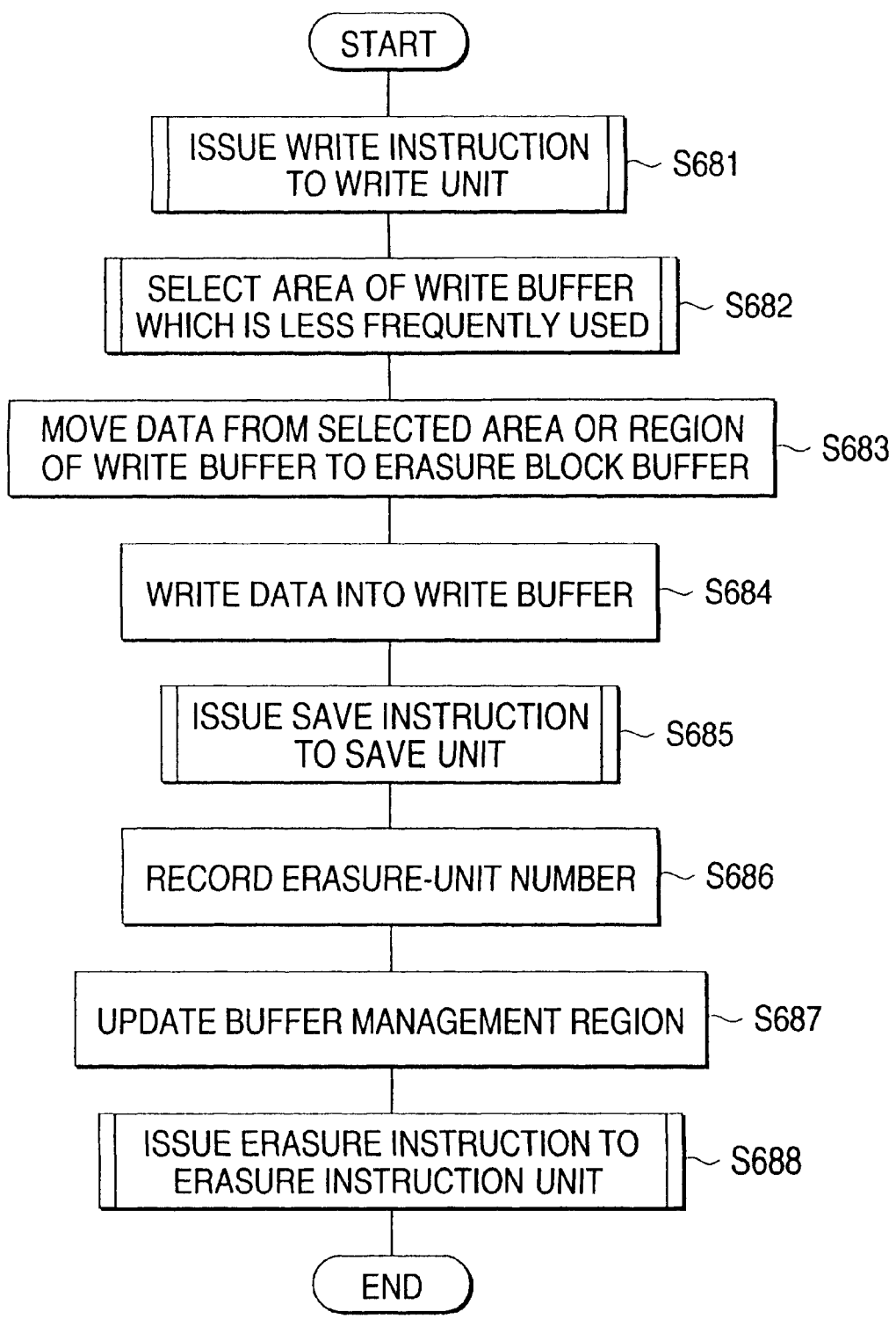
FIG. 17 is a flowchart showing the operation of the data processing device for performing buffer data movement processing according to the embodiment illustrated in FIG. 16.
Figure 18:
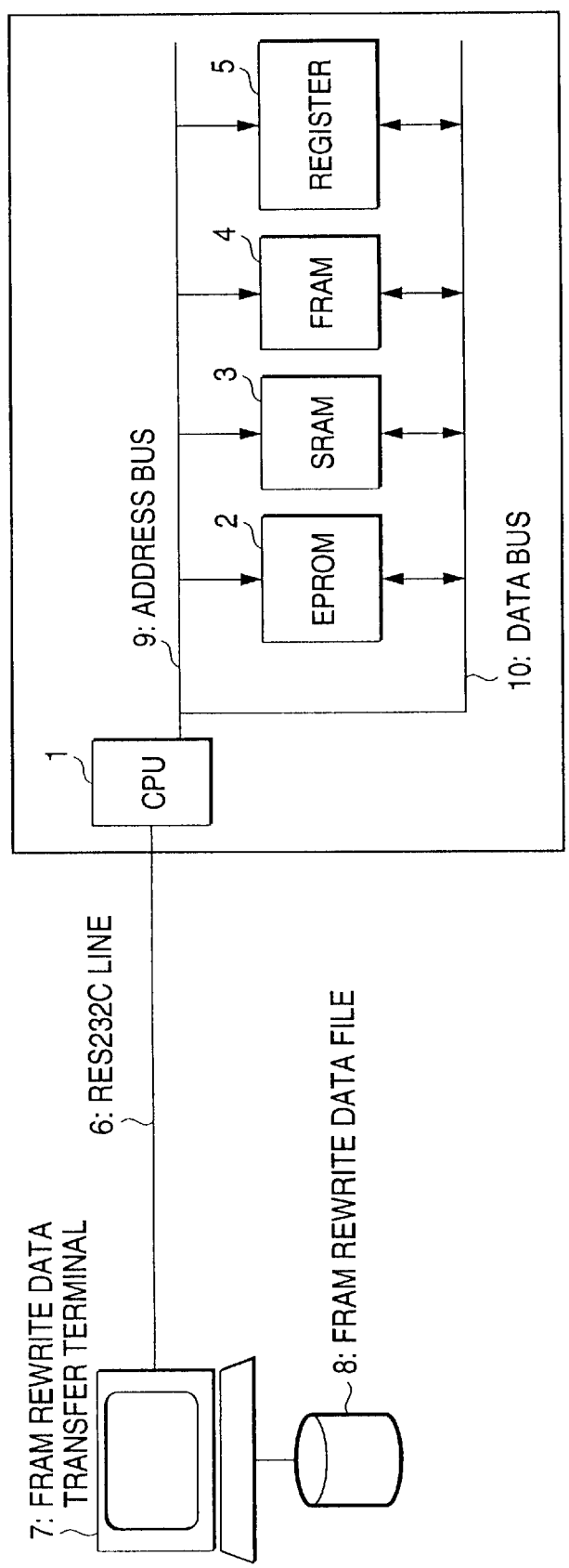
FIG. 18 is a block diagram of an existing data processing device.

The operation of the data processing device of the sixth embodiment performed at the time of writing of data will now be described by reference to FIGS. 16 and 17. Unless otherwise specified, the write control means 111 performs the following processing operations.

In step S601, the write controller 111 receives a data write request, and in step S602 there is calculated a number assigned to the erasure-unit region of the flash memory 101 containing the write request region. The details of the write request and the operation of the data processing device required for obtaining an erasure-unit number are the same as those described in connection with the first embodiment.

In step S603, a determination is made as to whether or not the erasure unit number is recorded in the erasure-unit-number hold region 202.

If the erasure unit number is not recorded in the erasure-unit-number hold region 202, the write request data in step S604 is written into the erasure block buffer 103.

In step S605 a save instruction is issued to the save unit 112. Upon receipt of the save instruction, the save unit 112 saves into the erasure block buffer 103 the non-changing data stored in the erasure-unit region.

In step S606 the erasure unit number determined, or calculated, in step S602 is recorded in the erasure-unit-number hold region 202.

In step S607, an erasure instruction is issued to the erasure instruction unit 301. Upon receipt of an erasure instruction, the erasure instruction unit 301 issues, to the flash memory 101, an instruction for erasing in erasure units the data which has already been saved in the erasure block buffer 103. The details of the erasure instruction are the same as those of the erasure instruction employed in the first embodiment.

If in step S603 the erasure unit number is determined to be recorded in the erasure-unit-number hold region 202, a determination is made in step S608, as to whether or not the erasure unit number calculated in step S602 matches the erasure unit number recorded in the erasure-unit-number hold region 302.

If in step S608 a determination is made that no match exists between the erasure unit numbers, a determination is made in step S609, as to whether or not the data belonging to an area identical with the write request region is recorded in the write buffer, by reference to the write buffer management region 403.

If in step S609 the data belonging to the area is determined not to be recorded, in step S610 a determination is made as to whether or not data belonging to the same erasure-unit region, whose number is identical with the erasure unit number obtained in step S602, is recorded in the write buffer, by reference to the write buffer management region 403.

If in step S610 a determination is made that data belonging to the same erasure-unit region is recorded in the write buffer, in step S620 there is effected buffer data movement processing (1). The buffer data movement processing (1) is the same as that which is described in connection with the fifth embodiment and is shown in FIG. 14, and hence repetition of its explanation is omitted here.

If in step S610 the data belonging to the same erasure-unit region determined not to be recorded in the write buffer 402, the write controller 111 in step S611, determines whether or not the write buffer 402 has an available memory location in which write request data can be written.

If in step S611 the write buffer 402 is determined not to have any available memory location, buffer data movement processing (2) is performed in step S612, which will be described later.

If in step S611 the write buffer 402 is determined to have an available memory location, the write controller 111 in step S613, writes write request data into the write buffer 402.

Next, in step S614 an erasure unit number, an offset value for specifying the position of a write region in the erasure unit region, and a data size are recorded, as data representing a location in the flash memory, in a portion of the write buffer management region 403, which portion corresponds to the buffer having the data written therein. Further, counters or serial numbers representing a sequence in which data is written (hereinafter referred to simply as "write counters" or "write serial numbers", respectively) and a value of 1 which is an initial value of the number of times data is written into the write buffer are recorded as data pertaining to the frequency of use of the write buffer.

If in step S609 the data belonging to an area identical with data from the write request region is determined to exist, the write controller 111 in step S630, writes write request data into the write buffer 402.

In step S631 the write serial numbers are recorded in the write buffer management region 403, as data pertaining to the frequency of use of a corresponding area of the write buffer region 402.

If in step S608, the erasure unit number calculated in step S602 is determined to match the erasure unit number recorded in the erasure-unit number hold region 202, the write request data in step S630 is written into the erasure block buffer 103 in step S640.

The buffer data movement processing, which is effected when in step S611 the write buffer 402 is determined not to have any available memory location, will be described by reference to FIG. 17. Unless otherwise specified, the write controller 111 performs the following processing operations.

In step S681, a write instruction is issued and the data currently stored in the erasure block buffer 103 is written into the flash memory 101.

In step S682, data from the write buffer management region 403 is retrieved, and the area of the write buffer 402 which is less frequently used is selected. The frequency of use of an area of the write buffer 402 is determined through use of the write serial numbers recorded in the write buffer management region 403, as well as the number of times data is written. If any area of the write buffer 402 is assigned the minimum serial number and the minimum number of times data is written, the area is selected. If no match exists between the area assigned the minimum serial number and the area assigned the minimum number of times data is written, the areas of the write buffer 402 are examined in terms of the number of times data is written, in ascending order of serial number, thereby selecting the area assigned the minimum number of times data is written.

In step S683, the data stored in the area of the write buffer 402, which was selected in step S682, is moved to the erasure block buffer 103.

In step S684, the write request data is written into the area of the write buffer 402 in which the data that has been moved to the erasure block buffer 103 has been recorded.

In step S685, the write controller 111 issues, to the save unit 112, a save instruction for saving the data recorded in the erasure-unit region of the flash memory 101 containing the data that has been moved to the erasure block buffer 103. Pursuant to the save instruction, the save unit 112 saves to the erasure block buffer 103 the non-changing data from the erasure-unit region of the flash memory 101.

In step S686, the number assigned to the erasure-unit region from which the data has been saved in step S685 is recorded in the erasure-unit-number hold region 202.

In step S687, the portion of the write buffer management region 403 corresponding to the area of the write buffer 402 from which the data has been moved to the erasure block buffer 103 is updated so as to correspond to the newly written data.

Finally, in step S688, an erasure instruction is issued to the erasure instruction unit 301. Upon receipt of the erasure instruction, the erasure instruction unit 301 issues, to the flash memory 101, an instruction for erasing in erasure units the data saved in the erasure block buffer 103.

The preceding processing operations are executed every time a write request is issued.

The reading operation of the data processing device of the sixth embodiment is the same as that of the data processing device employed in the fourth embodiment.

As mentioned above, in the data processing device of the sixth embodiment, the data recorded in the areas of the write buffer 402, the areas being assigned low frequencies of use, are written into the flash memory 101 in preference to the data stored in the other areas of the write buffer 402. Thereby enabling efficient use of the write buffer. Accordingly, in addition to yielding the advantage achieved in the fifth embodiment, the present embodiment can yield an advantage of diminishing the number of times data is written in flash memory, thus preventing deterioration of the flash memory.

Even if supply of power to a data processing device is interrupted during a period from the time non-changing data are erased from the memory until before first write data are written into the memory, loss of the non-changing data and the first write data is prevented, thus improving the reliability of rewriting of data stored in the memory.

Even if a plurality of write requests are issued, data can be collectively written into the first erasure-unit region, thus preventing the deterioration of the memory.

Even in a case where requests for writing data into a single erasure-unit region are continuously issued, writing of data into the single erasure-unit region can be collectively effected, thus preventing deterioration of the memory.

Because there is eliminated a necessity for performing processing pertaining to the erasure step, when processing pertaining to the memory write step is performed, the time required for performing processing pertaining to the memory write step is shortened. Furthermore, the time required for performing processing pertaining to the memory write step can be shortened.

Because the data storage method of the present invention enables utilization of a buffer more effectively than a data storage method employing erasure block buffers for use with second and third write requests, the number of times data is written over the memory can be diminished, thus enabling prevention of deterioration of the memory.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A data storage method for rewriting data into a rewritable memory, the method for rewriting comprising the steps of:
    writing write data to an erasure block buffer, wherein said erasure block buffer comprises a first region of a nonvolatile memory;
    copying non-changing data from said rewritable memory to said erasure block buffer, said rewritable memory having a plurality of erasure-unit regions wherein said non-changing data is written in predetermined units;
    recording an erasure unit number into an erasure-unit-number hold region, said erasure-unit-number hold region comprising a second region of said nonvolatile memory;
    erasing said non-changing data only from said erasure-unit regions which are to be rewritten;
    determining a status of said erasure unit number;
    transferring said non-changing data and said write data from said erasure block buffer to at least one of said erasure-unit regions in said rewritable memory depending on said status of said erasure unit number, wherein during an interruption of said transferring step, said transferring step is resumed in response to said status of said erasure unit number; and
    nullifying said erasure unit number in said erasure-unit-number hold region when said transferring step is complete.

2. The data storage method according to claim 1,
    wherein said step of writing write data is performed in response to a first write request which requests writing of the write data into said at least one erasure-unit region of said rewritable memory;
    wherein said step of copying non-changing data is performed in response to the first write request; and
    wherein said step of erasing the non-changing data from said at least one erasure-unit region is performed after said step of copying non-changing data is complete.

3. The data storage method according to claim 1, further comprising:
    writing a second write data into a write buffer in response to a second write request for requesting writing of the second write data, after said step of writing write data, said write buffer comprising a third region of said nonvolatile memory; and
    wherein said step of transferring said non-changing data and said write data from said erasure block buffer to said at least one erasure-unit region is performed after said step of writing second write data.

4. The data storage method according to claim 3, wherein
    said status of said erasure unit number is determined by a comparison step of comparing said at least one erasure-unit region into which the write data is to be written with said at least one erasure-unit region to which the second write data is to be written, and
    in a case where a match is obtained as a comparison result in the comparison step, processing pertaining to said step of writing second data and processing pertaining to the step of transferring said non-changing data and said write data are performed.

5. A data storage method for rewriting data into a memory, the method for rewriting data comprising:

writing write data to an erasure block buffer, wherein said erasure block buffer is nonvolatile;

copying non-changing data from said memory to said erasure block buffer, said memory having a plurality of erasure-unit regions wherein said non-changing data is written in predetermined units;

erasing said non-changing data from said erasure-unit regions;

transferring said non changing data and said write data from said erasure block buffer to said memory;

writing first write data, during a first erasure block buffer write step, to said erasure block buffer, in response to a first write request for requesting writing of the first write data to a first erasure-unit region of said memory;

writing into said erasure block buffer non-changing data recorded in the first erasure-unit region, during a second erasure block buffer write step, in response to the first write request for requesting writing of the first write data to the first erasure-unit region of said memory;

erasing data, during an erasure step, from the first erasure-unit region after the second erasure block buffer write step; and writing data stored in said erasure block buffer, during a memory write step, to the first erasure-unit region from which the data have been erased in the erasure step, in response to a second write request for requesting writing of second write data into said memory.

6. The data storage method as defined in claim 5, wherein the erasure step is followed by a comparison step of comparing the erasure-unit region to which the first write data is to be written with the erasure-unit region to which the second write data is to be written, and in a case where a match is obtained as a comparison result in the comparison step, processing pertaining to the memory write step is performed.

7. A data storage method for rewriting data into a rewritable memory, the method for rewriting comprising the steps of:

writing first write data to an erasure block buffer, wherein said erasure block buffer comprises a first region of a nonvolatile memory;

writing second write data to a write buffer, wherein said write buffer comprises a second region of said nonvolatile memory;

copying non-changing data from said rewritable memory to said erasure block buffer, said rewritable memory having a plurality of erasure-unit regions wherein said non-changing data is written in predetermined units;

recording an erasure unit number into an erasure-unit-number hold region, said erasure-unit-number hold region comprising a third region of said nonvolatile memory;

erasing said non-changing data only from said erasure-unit regions which are to be rewritten;

determining a status of said erasure unit number;

transferring said non-changing data and said first and second write data to said rewritable memory, wherein said non-changing data is transferred from said erasure block buffer, said first write data is transferred from said erasure block buffer, and said second write data is transferred from said write buffer depending on said status of said erasure unit number, wherein during an interruption of said transferring step, said transferring step is resumed in response to said status of said erasure unit number; and nullifying said erasure unit number in said erasure-unit-number hold region when said transferring,step is complete.

8. The data storage method according to claim 7, wherein said step of writing said first write data to said erasure block buffer and said step of copying said non-changing data to said erasure block buffer is performed in response to a first write request for requesting writing of the first write data to a first erasure-unit region of said rewritable memory;

wherein said step of writing said second write data into said write buffer is performed in response to a second write request for requesting writing of the second write data to a second erasure-unit region of said rewritable memory, after the erasure block buffer write step; and wherein a further step of writing a third write data into said write buffer is performed, in response to a third write request for requesting writing of the third write data to an erasure-unit region of said rewritable memory, after said step of writing said second write data to said write buffer.

9. The data storage method according to claim 8, wherein said status of said erasure unit number is determined by a comparison step of comparing a write request region which specifies a location in said rewritable memory in which the second write data is to be written with a write request region- which specifies a location in said rewritable memory in which the third write data is to be written, wherein in a case where the write request region into which the third write data is to be written is included in the write request region in which the second write data is to be written, the third write data overwrites the area of said write buffer where the second write data is written.

10. The data storage method according to claim 7, further comprising:

wherein said step of writing said first write data to said erasure block buffer and said step of copying said non-changing data to said erasure block buffer is performed in response to a first write request for requesting writing of the first write data to a first erasure-unit region of said rewritable memory;

wherein said step of writing said second write data to said write buffer is performed in response to a second write request for requesting writing of the second write data to a second erasure-unit region of said rewritable memory, after said step of writing said first write data and said step of copying said non-changing data to said erasure block buffer:

wherein said step of transferring said non-changing data and said first write data to said rewritable memory is performed after said step of writing said second write data into said write buffer and in a case where there arises a third write request for requesting writing third write data to an erasure-unit region of said rewritable memory; and wherein the second write data, the third write data, and the non-changing data stored in the second erasure-unit region is written to said erasure block buffer, after said step of transferring said non-changing data and said first write data from said erasure unit region into said rewritable memory.

11. The data storage method as defined in claim 10, wherein
    said status of said erasure unit number is determined by a comparison step of comparing said erasure-unit region to which the second write data is to be written with said erasure-unit region into which the third write data is to be written, and
    in a case where a match is obtained as a comparison result in the comparison step, processing pertaining to said step of writing second data and processing pertaining to the step of transferring said first write data and said non-changing data are performed.

12. A data processing device comprising:
    a rewritable memory having a plurality of erasure-unit regions wherein data is written in predetermined units to said erasure-unit regions, and wherein data is erased in predetermined units from said rewritable memory;
    an erasure block buffer comprising a first region of a nonvolatile memory, said erasure block buffer permitting writing of data to said rewritable memory in arbitrary units, said erasure block buffer storing data that is erased to said rewritable memory; and
    an erasure-unit-number hold region comprising a second region of said nonvolatile memory for recording an erasure unit number, wherein during an interruption of processing, a status of said erasure unit number is determined and depending on said status, processing resumes.

13. The data processing device according to claim 12, further comprising:
    erasure means for erasing the data stored in the erasure-unit regions in the predetermined units and for rewriting the data stored in the erasure-unit region through use of first write data;
    write control means including a data write means for writing the first write data into said erasure block buffer;
    save means for writing, into said erasure block buffer, non-changing data which are not to be rewritten by the first write data from among the data stored in the erasure-unit regions of said rewritable memory; and
    memory write means for writing the first write data and the non-changing data, both data sets being written into said erasure block buffer, to the erasure-unit region from which the data have been erased by said erasure means.

14. The data processing device according to claim 12, wherein
    said erasure block buffer stores both write data to be written to the erasure-unit regions and non-changing data stored in the erasure-unit regions; and wherein the data processing device further comprises:
        write control means including a data write means for writing first write data into said erasure block buffer, in response to a first write request for requesting writing of the first write data into a first erasure-unit region of said rewritable memory;
        save means for writing to said erasure block buffer non-changing data stored in the first erasure-unit region, in response to the first request for requesting writing of the first write data to the first erasure-unit region of said rewritable memory; and
    memory write means for writing to the first erasure-unit region the data written in said erasure block buffer, wherein
        said erasure block buffer retains the first write data and the non-changing data stored in the first erasure-unit region, until a second write request is issued after the first write request; and wherein
            said data write means writes the second write data into; said erasure block buffer in a case where the second write request requests writing of the second write data into the first erasure-unit region, and the memory write means writing, to the first erasure-unit region, data belonging to said erasure block buffer in which the second write data are written.

15. The data processing device according to claim 12, wherein
    said erasure block buffer stores both write data to be written to the erasure-unit regions and non-changing data stored in the erasure-unit regions, wherein the data processing device further comprises:
        a write buffer comprising a third region of said nonvolatile memory, for storing the write data without storing the non-changing data;
        write control means including a data write means for writing first write data into said erasure block buffer, in response to a first write request for requesting writing of the first write data into a first erasure-unit region of said rewritable memory; and
        save means for writing into said erasure block buffer non-changing data stored in the first erasure-unit region, in response to the first erasure-unit region of said rewritable memory;
    wherein said write control means further includes write buffer write means for writing second write data to said write buffer, in response to a second write request for writing the second write data into a second erasure-unit region of said rewritable memory, wherein
        said write buffer retains the second write data until a third write request is issued after the second write request; and wherein
            said write buffer write means writes third write data into said write buffer in a case where the third write request requests writing of a third write data to the write request region for the second write data.

* * * * *